(12) United States Patent
Kikuchi et al.

(10) Patent No.: US 11,817,562 B2
(45) Date of Patent: Nov. 14, 2023

(54) VEHICLE, VEHICLE CONTROL SYSTEM, AND VEHICLE CONTROL METHOD

(71) Applicant: TOYOTA JIDOSHA KABUSHIKI KAISHA, Toyota (JP)

(72) Inventors: Yoshiaki Kikuchi, Toyota (JP); Junichi Matsumoto, Toyota (JP); Akio Uotani, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 401 days.

(21) Appl. No.: 17/116,027

(22) Filed: Dec. 9, 2020

(65) Prior Publication Data

US 2021/0194066 A1 Jun. 24, 2021

(30) Foreign Application Priority Data

Dec. 19, 2019 (JP) ................. 2019-229535

(51) Int. Cl.
*H01M 10/42* (2006.01)
*B60L 58/13* (2019.01)
*G01R 31/382* (2019.01)

(52) U.S. Cl.
CPC ........... *H01M 10/425* (2013.01); *B60L 58/13* (2019.02); *G01R 31/382* (2019.01); *H01M 2010/4271* (2013.01)

(58) Field of Classification Search
CPC ....... H01M 10/425; H01M 2010/4271; H01M 2220/20; G01R 31/382; G01R 31/396; B60L 58/13; Y02E 60/10; Y02T 10/70
See application file for complete search history.

(56) References Cited

U.S. PATENT DOCUMENTS 11,198,375 B2 12/2021 Kikuchi et al.
2008/0156551 A1 7/2008 Kawahara et al.
(Continued)

FOREIGN PATENT DOCUMENTS

CN 102695627 B 10/2014
CN 109760549 A 5/2019
(Continued)

OTHER PUBLICATIONS

Jan. 17, 2023 Notice of Allowance issued in U.S. Appl. No. 17/109,817.

(Continued)

*Primary Examiner* — Tyler J Lee
*Assistant Examiner* — Yufeng Zhang
(74) *Attorney, Agent, or Firm* — Oliff PLC

(57) ABSTRACT

A vehicle includes: a battery pack including a secondary battery, a battery sensor that detects a state of the secondary battery, and a first control device; a second control device provided separately from the battery pack; and a converter. The first control device is configured to use a detection value of the battery sensor to obtain a current upper limit value indicating an upper limit value of an output current of the secondary battery. The second control device is configured to use a power upper limit value indicating an upper limit value of an output power of the secondary battery to control the output power of the secondary battery. The converter is configured to perform conversion of the current upper limit value into the power upper limit value.

6 Claims, 12 Drawing Sheets

(56) References Cited

U.S. PATENT DOCUMENTS

| | | | |
|---|---|---|---|
| 2010/0079111 A1 | 4/2010 | Masuda | |
| 2012/0330486 A1 | 12/2012 | Jingu | |
| 2013/0200846 A1* | 8/2013 | Ang | B60L 1/003 |
| | | | 320/109 |
| 2014/0111164 A1 | 4/2014 | Ohkawa et al. | |
| 2017/0059662 A1 | 3/2017 | Cha et al. | |
| 2017/0158189 A1 | 6/2017 | Kazuno et al. | |
| 2018/0304766 A1* | 10/2018 | Kakeno | B60L 7/18 |
| 2019/0143820 A1 | 5/2019 | Ying | |
| 2019/0263279 A1 | 8/2019 | Kyojo et al. | |
| 2021/0188108 A1 | 6/2021 | Kikuchi et al. | |
| 2021/0188116 A1 | 6/2021 | Kikuchi et al. | |
| 2021/0188117 A1 | 6/2021 | Kikuchi et al. | |
| 2021/0188118 A1 | 6/2021 | Kikuchi et al. | |
| 2021/0188119 A1 | 6/2021 | Kikuchi et al. | |
| 2021/0188123 A1 | 6/2021 | Kikuchi et al. | |
| 2021/0199119 A1 | 7/2021 | Guo et al. | |
| 2023/0006453 A1 | 1/2023 | Okada et al. | |

FOREIGN PATENT DOCUMENTS

| | | |
|---|---|---|
| CN | 110470994 A | 11/2019 |
| JP | 2000-002758 A | 1/2000 |
| JP | 2008-104289 A | 5/2008 |
| JP | 2008-312391 A | 12/2008 |
| JP | 2010-088167 A | 4/2010 |
| JP | 2012-135110 A | 7/2012 |
| JP | 2013-233010 A | 11/2013 |
| JP | 2014-058267 A | 4/2014 |
| JP | 5741189 B2 | 7/2015 |
| JP | 2016-181985 A | 10/2016 |
| JP | 6256321 B2 | 1/2018 |
| JP | 2019-156007 A | 9/2019 |
| JP | 2019-175594 A | 10/2019 |
| KR | 10-1798201 B1 | 11/2017 |
| WO | 2012/169063 A1 | 12/2012 |

OTHER PUBLICATIONS

Jan. 23, 2023 Corrected Notice of Allowance issued in U.S. Appl. No. 17/109,817.

U.S. Appl. No. 17/109,817, filed Dec. 2, 2020 in the name of Yoshiaki Kikuchi et al.

Apr. 4, 2022 Office Action issued in U.S. Appl. No. 17/109,817.

Aug. 18, 2022 Office Action issued in U.S. Appl. No. 17/109,817.

U.S. Appl. No. 17/113,486, filed Dec. 7, 2020 in the name of Yoshiaki Kikuchi et al.

U.S. Appl. No. 17/117,370, filed Dec. 10, 2020 in the name of Yoshiaki Kikuchi et al.

U.S. Appl. No. 17/113,760, filed Dec. 7, 2020 in the name of Yoshiaki Kikuchi et al.

Sep. 14, 2022 Office Action issued in U.S. Appl. No. 17/109,817.

Mar. 17, 2023 Office Action issued in U.S. Appl. No. 17/117,370.

May 8, 2023 Office Action issued in U.S. Appl. No. 17/109,817.

Aug. 11, 2023 Office Action issued in U.S. Appl. No. 17/117,370.

* cited by examiner

VEHICLE, VEHICLE CONTROL SYSTEM, AND VEHICLE CONTROL METHOD

INCORPORATION BY REFERENCE

The disclosure of Japanese Patent Application No. 2019-229535 filed on Dec. 19, 2019 including the specification, drawings and abstract is incorporated herein by reference in its entirety.

BACKGROUND

1. Technical Field

The present disclosure relates to a vehicle, a vehicle control system, and a vehicle control method.

2. Description of Related Art

Japanese Unexamined Patent Application Publication No. 2019-156007 (JP 2019-156007 A) discloses a control device that controls output power of a secondary battery using a power upper limit value (Wout) indicating an upper limit value of the output power of the secondary battery mounted on a vehicle.

SUMMARY

Electrically driven vehicles (for example, electric vehicles or hybrid vehicles) that use a secondary battery as a power source have spread in recent years. In the electrically driven vehicles, when the capacity or the performance of the secondary battery decreases due to battery deterioration or the like, it is conceivable that the secondary battery mounted on the electrically driven vehicle is replaced.

The secondary battery is generally mounted on a vehicle in the form of a battery pack. The battery pack includes a secondary battery, a sensor that detects the state of the secondary battery (for example, current, voltage, and temperature), and a control device. Hereinafter, the control device incorporated in the battery pack may be referred to as "battery electronic control unit (ECU)", and the sensor incorporated in the battery pack may be referred to as "battery sensor". Peripheral devices (for example, a sensor and a control device) suitable for the secondary battery are mounted on the battery pack. The battery pack is maintained so that the secondary battery and its peripheral devices can operate normally. Therefore, when replacing the secondary battery mounted on the vehicle, it is considered preferable to replace not only the secondary battery but the entire battery pack mounted on the vehicle from the viewpoint of vehicle maintenance.

As described in JP 2019-156007 A, there is a known control device that is mounted on a vehicle separately from a battery pack and that controls the output power of the secondary battery using a power upper limit value (hereinafter, also referred to as "power restricting control device"). The power restricting control device is configured to perform power-based output restriction. The power-based output restriction is a process of controlling the output power of the secondary battery so that the output power of the secondary battery does not exceed the power upper limit value. In general, a vehicle including a control device that performs the power-based output restriction is equipped with a battery pack including a battery ECU that obtains a power upper limit value using a detection value from a battery sensor (hereinafter, also referred to as "power restricting battery pack").

On the other hand, a control device is known that is mounted on a vehicle separately from the battery pack and that controls the output current of the secondary battery using a current upper limit value indicating an upper limit value of the output current of the secondary battery (hereinafter, also referred to as "current restricting control device"). The current restricting control device is configured to perform current-based output restriction. The current-based output restriction is a process of controlling the output current of the secondary battery so that the output current of the secondary battery does not exceed a current upper limit value. In general, a vehicle including a control device that performs the current-based output restriction is equipped with a battery pack including a battery ECU that obtains a current upper limit value using a detection value from a battery sensor (hereinafter, also referred to as "current restricting battery pack").

Depending on the situation of supply and demand (or the stock status) of the battery pack, the current restricting battery pack may be more easily available than the power restricting battery pack. However, regarding the vehicle of the related art, it has not been expected to use a current restricting battery pack and a power restricting control device in combination, so no study has been conducted on means for using a current restricting battery pack and a power restricting control device in combination. Thus, it is difficult to adopt a current restricting battery pack in a vehicle equipped with a power restricting control device.

The present disclosure provides a vehicle, a vehicle control system, and a vehicle control method that can perform power-based output restriction on a secondary battery included in a current restricting battery pack.

A vehicle according to a first aspect of the present disclosure includes a battery pack including a first control device, and a second control device and a converter provided separately from the battery pack. The battery pack further includes a secondary battery and a battery sensor that detects a state of the secondary battery. The first control device is configured to use a detection value of the battery sensor to obtain a current upper limit value indicating an upper limit value of an output current of the secondary battery. The second control device is configured to use a power upper limit value indicating an upper limit value of an output power of the secondary battery to control the output power of the secondary battery. The converter is configured to perform conversion of the current upper limit value into the power upper limit value by performing multiplication of a voltage value of the secondary battery in a state where a current corresponding to the current upper limit value is flowing (hereinafter, referred to as "estimated voltage value") by the current upper limit value.

The vehicle is equipped with the converter that converts the current upper limit value into the power upper limit value. The voltage of the secondary battery changes depending on the magnitude of the current. The converter uses the estimated voltage value (that is, the voltage value of the secondary battery in the state where the current corresponding to the current upper limit value is flowing) to convert the current upper limit value into the power upper limit value. Specifically, the converter converts the current upper limit value into the power upper limit value by multiplying the current upper limit value by the estimated voltage value. This makes it possible to obtain the power upper limit value corresponding to the current upper limit value with high accuracy. According to the above configuration, the second control device can appropriately perform power-based output restriction even when the current restricting battery pack is adopted. The second control device corresponds to the power restricting control device described above.

In the above aspect, the converter may be configured to use measured values of a current and a voltage of the secondary battery that are detected by the battery sensor, an internal resistance of the secondary battery, and the current upper limit value to obtain the estimated voltage value.

The converter having the above configuration can easily and appropriately obtain the estimated voltage value. Then, the converter can convert the current upper limit value into the power upper limit value with high accuracy using the estimated voltage value obtained as described above. Hereinafter, the measured values of the current and the voltage of the secondary battery that are detected by the battery sensor may be referred to as "actual current" and "actual voltage". The current, the voltage, and the internal resistance of the secondary battery have a relationship represented by "internal resistance=voltage/current". The internal resistance of the secondary battery that is used to obtain the estimated voltage value may be stored in advance in a storage device. The internal resistance of the secondary battery stored in the storage device may take a fixed value or may be variable in accordance with the temperature of the secondary battery. The converter described above may obtain the estimated voltage value based on the actual current, the actual voltage, the current upper limit value, and the internal resistance, in accordance with an expression "estimated voltage value=actual voltage+(current upper limit value−actual current)×internal resistance".

In the above aspect, the vehicle may further include a third control device provided separately from the battery pack and configured to relay communication between the first control device and the second control device. The converter may be mounted on the third control device. The battery pack may be configured to output the current upper limit value. The vehicle may be configured such that when the current upper limit value is input from the battery pack to the third control device, the converter performs the conversion of the current upper limit value into the power upper limit value and the power upper limit value is output from the third control device to the second control device.

In the above configuration, the third control device provided separately from the battery pack includes the converter, and the converter converts the current upper limit value into the power upper limit value. Thus, the converter can be mounted on the vehicle without a change in the configurations of the battery pack (including the first control device) and the second control device.

In the above aspect, the third control device may be configured to perform the conversion and output the power upper limit value when the current upper limit value is input and to output the power upper limit value without performing the conversion when the power upper limit value is input.

In the above aspect, when the vehicle is equipped with the current restricting battery pack, the third control device performs the conversion on the current upper limit value input from the current restricting battery pack and outputs the power upper limit value. On the other hand, when the vehicle is equipped with the power restricting battery pack, the third control device outputs the power upper limit value without performing the conversion on the power upper limit value input from the power restricting battery pack. Thus, according to the above configuration, the second control device can appropriately perform the power-based output restriction in both a case where the current restricting battery pack is adopted and a case where the power restricting battery pack is adopted.

In the above aspect, each of the first control device, the second control device, and the third control device may be a microcomputer connected to an in-vehicle local area network (LAN). In the in-vehicle LAN, the first control device may be connected to the second control device via the third control device to communicate with the second control device via the third control device.

Note that LAN is an abbreviation for "local area network". In the above aspect, each of the first to third control devices is a microcomputer. The microcomputer has a small size and a high processing capacity, so it is suitable as an in-vehicle control device. The third control device can receive the current upper limit value from the first control device through the in-vehicle LAN, convert the current upper limit value into the power upper limit value with the converter, and then transmit the power upper limit value to the second control device through the in-vehicle LAN. With the above configuration, each control device can suitably perform the required calculation and communication. As the communication protocol of the in-vehicle LAN, a controller area network (CAN) or FlexRay may be adopted.

The third control device can also be used for purposes other than the conversion of the upper limit value (that is, conversion from the current upper limit value into the power upper limit value). The third control device may be configured to manage information (for example, accumulate vehicle data). Further, the third control device may function as a central gateway (CGW).

In the above aspect, the converter may be mounted on the first control device. The first control device may be configured to perform, with the converter, the conversion of the current upper limit value obtained using the detection value of the battery sensor into the power upper limit value and to output the power upper limit value to the second control device when the first control device is connected to the second control device.

The converter may be incorporated in the first control device (that is, inside the battery pack). In this configuration, the current upper limit value can be converted into the power upper limit value inside the battery pack and the power upper limit value can be output from the battery pack. Thus, the second control device can appropriately perform the power-based output restriction without adding the third control device.

In the above aspect, the converter may be mounted on the second control device. The battery pack may be configured to output the current upper limit value. The second control device may be configured to perform, with the converter, the conversion of the current upper limit value input from the battery pack into the power upper limit value and to control the output power of the secondary battery such that the output power of the secondary battery does not exceed the power upper limit value.

In the above configuration, the second control device provided separately from the battery pack includes the converter, and the converter converts the current upper limit value into the power upper limit value. Therefore, the converter can be mounted on the vehicle without a change in the configuration of the battery pack (including the first control device). Further, the second control device can appropriately perform the power-based output restriction without adding the third control device.

The vehicle of the above aspect may be an electrically driven vehicle that travels using electric power stored in the secondary battery in the battery pack. The electrically driven vehicle includes an electric vehicle (EV), a hybrid vehicle (HV), and a plug-in hybrid vehicle (PHV).

The vehicle may be a hybrid vehicle including a first motor generator, a second motor generator, and an engine. Electric power may be supplied to each of the first motor generator and the second motor generator from the secondary battery in the battery pack. Each of the engine and the first motor generator may be mechanically connected to drive wheels of the hybrid vehicle via a planetary gear. The planetary gear and the second motor generator may be configured such that drive force output from the planetary gear and drive force output from the second motor generator are combined and transmitted to the drive wheels. The second control device may create a control command for each of the first motor generator, the second motor generator, and the engine so that the output power of the secondary battery does not exceed the power upper limit value.

A vehicle control system according to a second aspect of the present disclosure is configured such that a battery pack including a secondary battery and a battery sensor that detects a state of the secondary battery is attached to the vehicle control system. The vehicle control system includes a control unit configured to control an output power of the secondary battery such that the output power of the secondary battery does not exceed a power upper limit value when the battery pack is attached to the vehicle control system, and a conversion unit configured such that when a current upper limit value indicating an upper limit value of an output current of the secondary battery and a detection value of the battery sensor are input from the battery pack, the conversion unit uses the detection value of the battery sensor and the current upper limit value to obtain an estimated voltage value (that is, a voltage value of the secondary battery in a state where a current corresponding to the current upper limit value is flowing) and performs conversion of the current upper limit value into the power upper limit value by performing multiplication of the current upper limit value by the estimated voltage value.

In the above aspect, the power upper limit value corresponding to the current upper limit value is obtained by multiplying the current upper limit value by the estimated voltage value. Therefore, even when the current restricting battery pack is adopted, it is possible to appropriately perform the power-based output restriction on the secondary battery included in the current restricting battery pack.

A vehicle control method according to a third aspect of the present disclosure includes: obtaining, with a vehicle control system to which a battery pack including a secondary battery and a battery sensor that detects a state of the secondary battery is attached, a current upper limit value indicating an upper limit value of an output current of the secondary battery and a detection value of the battery sensor, from the battery pack; obtaining, in a second step, with the vehicle control system, an estimated voltage value (that is, a voltage value of the secondary battery in a state where a current corresponding to the current upper limit value is flowing) using the detection value of the battery sensor and the current upper limit value; performing, in a third step, with the vehicle control system, conversion of the current upper limit value into a power upper limit value indicating an upper limit value of an output power of the secondary battery by performing multiplication of the current upper limit value by the estimated voltage value; and controlling, in a fourth step, with the vehicle control system, the output power of the secondary battery using the power upper limit value.

In the above aspect, the power upper limit value corresponding to the current upper limit value is obtained by multiplying the current upper limit value by the estimated voltage value. Therefore, even when the current restricting battery pack is adopted, it is possible to appropriately perform the power-based output restriction on the secondary battery included in the current restricting battery pack.

The above configuration makes it possible to provide a vehicle, a vehicle control system, and a vehicle control method that can perform power-based output restriction on a secondary battery included in a current restricting battery pack.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
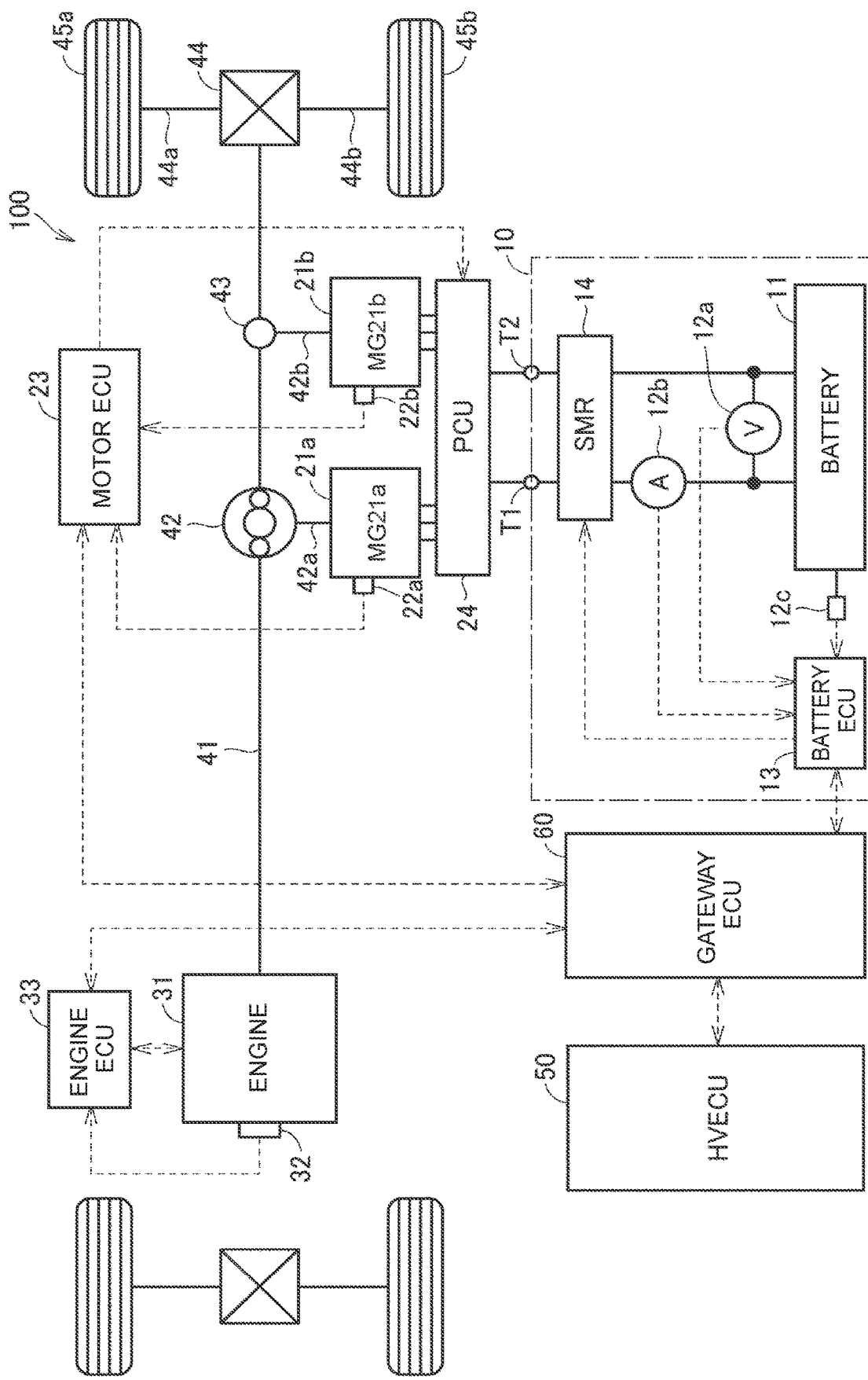
FIG. 1 is a diagram showing a configuration of a vehicle according to an embodiment of the present disclosure.

Embodiments of the present disclosure will be described in detail with reference to the drawings. It should be noted that the same or corresponding parts in the drawings are denoted by the same reference characters and repetitive description thereof will be omitted. Hereinafter, an electronic control unit is also referred to as "ECU".

FIG. 1 is a diagram showing a configuration of a vehicle according to the present embodiment. In the present embodiment, a front-wheel drive four-wheel vehicle (more specifically, a hybrid vehicle) is assumed to be used, but the number of wheels and the drive system can be changed as appropriate. For example, the drive system may be four-wheel drive.

Referring to FIG. 1, a vehicle 100 is equipped with a battery pack 10 including a battery ECU 13. Further, a motor ECU 23, an engine ECU 33, an HV ECU 50, and a gateway ECU 60 are mounted on the vehicle 100 separately from the battery pack 10. The motor ECU 23, the engine ECU 33, the HV ECU 50, and the gateway ECU 60 are located outside the battery pack 10. The battery ECU 13 is located inside the battery pack 10. In the present embodiment, the battery ECU 13, the HV ECU 50, and the gateway ECU 60 correspond to examples of a "first control device", a "second control device", and a "third control device" according to the present disclosure, respectively.

The battery pack 10 includes a battery 11, a voltage sensor 12a, a current sensor 12b, a temperature sensor 12c, the battery ECU 13, and a system main relay (SMR) 14. The battery 11 functions as a secondary battery. In the present embodiment, an assembled battery including a plurality of electrically connected lithium ion batteries is adopted as the battery 11. Each secondary battery that constitutes the assembled battery is also referred to as a "cell". In the present embodiment, each lithium ion battery that constitutes the battery 11 corresponds to the "cell". The secondary battery included in the battery pack 10 is not limited to the lithium ion battery and may be another secondary battery (for example, a nickel metal hydride battery). An electrolytic solution secondary battery or an all-solid-state secondary battery may be used as the secondary battery.

The voltage sensor 12a detects the voltage of each cell of the battery 11. The current sensor 12b detects current flowing through the battery 11 (the charging side takes a negative value). The temperature sensor 12c detects the temperature of each cell of the battery 11. The sensors output the detection results to the battery ECU 13. The current sensor 12b is provided in the current path of the battery 11. In the present embodiment, one voltage sensor 12a and one temperature sensor 12c are provided for each cell. However, the present disclosure is not limited to this, and one voltage sensor 12a and one temperature sensor 12c may be provided for each set of multiple cells, or only one voltage sensor 12a and one temperature sensor 12c may be provided for one assembled battery. Hereinafter, the voltage sensor 12a, the current sensor 12b, and the temperature sensor 12c are collectively referred to as "battery sensor 12". The battery sensor 12 may be a battery management system (BMS) that has a state of charge (SOC) estimation function, a state of health (SOH) estimation function, a cell voltage equalization function, a diagnostic function, and a communication function in addition to the above sensor functions.

The SMR 14 is configured to switch connection and disconnection of power paths connecting external connection terminals T1 and T2 of the battery pack 10 and the battery 11. For example, an electromagnetic mechanical relay can be used as the SMR 14. In the present embodiment, a power control unit (PCU) 24 is connected to the external connection terminals T1 and T2 of the battery pack 10. The battery 11 is connected to the PCU 24 via the SMR 14. When the SMR 14 is in the closed state (connected state), power can be transmitted between the battery 11 and the PCU 24. In contrast, when the SMR 14 is in the open state (disconnected state), the power paths connecting the battery 11 and the PCU 24 are disconnected. In the present embodiment, the SMR 14 is controlled by the battery ECU 13. The battery ECU 13 controls the SMR 14 according to an instruction from the HV ECU 50. The SMR 14 is in the closed state (connected state) when the vehicle 100 is traveling, for example.

The vehicle 100 includes an engine 31, a first motor generator 21a (hereinafter referred to as "MG 21a"), and a second motor generator 21b (hereinafter referred to as "MG 21b") as power sources for traveling. The MG 21a and the MG 21b are motor generators that have both a function as a motor that outputs torque by receiving drive power and a function as a generator that generates electric power by receiving the torque. An alternating current (AC) motor (for example, a permanent magnet synchronous motor or an induction motor) is used as the MG 21a and the MG 21b. The MG 21a and the MG 21b are electrically connected to the battery 11 via the PCU 24. The MG 21a has a rotor shaft 42a and the MG 21b has a rotor shaft 42b. The rotor shaft 42a corresponds to a rotation shaft of the MG 21a, and the rotor shaft 42b corresponds to a rotation shaft of the MG 21b.

The vehicle 100 further includes a single-pinion planetary gear 42. An output shaft 41 of the engine 31 and the rotor shaft 42a of the MG 21a are connected to the planetary gear 42. The engine 31 is, for example, a spark-ignition internal combustion engine including a plurality of cylinders (for example, four cylinders). The engine 31 combusts fuel (for example, gasoline) in each cylinder to generate drive force, and the generated drive force rotates a crankshaft (not shown) shared by all the cylinders. The crankshaft of the engine 31 is connected to the output shaft 41 via a torsional damper (not shown). The output shaft 41 rotates along with rotation of the crankshaft. The engine 31 is not limited to a gasoline engine and may be a diesel engine.

The planetary gear 42 has three rotating elements, namely, an input element, an output element, and a reaction force element. More specifically, the planetary gear 42 includes a sun gear, a ring gear that is arranged coaxially with the sun gear, a pinion gear that meshes with the sun gear and the ring gear, and a carrier that holds the pinion gear so that the pinion gear can rotate and revolve. The carrier corresponds to the input element, the ring gear corresponds to the output element, and the sun gear corresponds to the reaction force element.

The engine 31 and the MG 21a are mechanically connected to each other via the planetary gear 42. The output shaft 41 of the engine 31 is connected to the carrier of the planetary gear 42. The rotor shaft 42a of the MG 21a is connected to the sun gear of the planetary gear 42. The torque output from the engine 31 is input to the carrier. The planetary gear 42 is configured to divide the torque output from the engine 31 to the output shaft 41 into torque that is transmitted to the sun gear (eventually the MG 21a) and torque that is transmitted to the ring gear. When the torque output from engine 31 is output to the ring gear, reaction torque generated by the MG 21a acts on the sun gear.

The planetary gear 42 and the MG 21b are configured such that the drive force output from the planetary gear 42 (that is, drive force output to the ring gear) and the drive force output from the MG 21b (that is, drive force output to the rotor shaft 42b) are combined and transmitted to the drive wheels 45a and 45b. More specifically, an output gear (not shown) that meshes with a driven gear 43 is attached to the ring gear of the planetary gear 42. A drive gear (not shown) attached to the rotor shaft 42b of the MG 21b also meshes with the driven gear 43. The driven gear 43 combines the torque output from the MG 21b to the rotor shaft 42b and the torque output from the ring gear of the planetary gear 42. The drive torque thus combined is transmitted to a differential gear 44 and further transmitted to the drive wheels 45a and 45b via drive shafts 44a and 44b extending from the differential gear 44 to the right and left.

The MG 21a is provided with a motor sensor 22a that detects the state (for example, current, voltage, temperature, and rotation speed) of the MG 21a. The MG 21b is provided with a motor sensor 22b that detects the state (for example, current, voltage, temperature, and rotation speed) of the MG 21b. The motor sensors 22a and 22b output their detection results to the motor ECU 23. The engine 31 is provided with an engine sensor 32 that detects the state of the engine 31 (for example, intake air amount, intake pressure, intake temperature, exhaust pressure, exhaust temperature, catalyst temperature, engine coolant temperature, and engine speed). The engine sensor 32 outputs its detection result to the engine ECU 33.

The HV ECU 50 is configured to output a command (control command) for controlling the engine 31 to the engine ECU 33. The engine ECU 33 is configured to control various actuators of the engine 31 (for example, a throttle valve, an ignition device, and an injector (not shown)) in accordance with the command from the HV ECU 50. The HV ECU 50 can perform engine control through the engine ECU 33.

The HV ECU 50 is configured to output a command (control command) for controlling each of the MG 21a and the MG 21b to the motor ECU 23. The motor ECU 23 is configured to generate current signals (for example, signals indicating the magnitude and the frequency of the current) that match the target torque of each of the MG 21a and the MG 21b in accordance with the command from the HV ECU 50, and output the generated current signals to the PCU 24. The HV ECU 50 can perform motor control through the motor ECU 23.

The PCU 24 includes, for example, two inverters each corresponding to the MG 21a and the MG 21b and a converter (not shown) arranged between each inverter and the battery 11. The PCU 24 is configured to supply electric power accumulated in the battery 11 to each of the MG 21a and the MG 21b, and supply electric power generated by each of the MG 21a and the MG 21b to the battery 11. The PCU 24 is configured such that the states of the MG 21a and the MG 21b can be controlled separately, and, for example, the MG 21a can be in the power running state while the MG 21a is in the regenerative state (that is, the power generation state). The PCU 24 is configured to be able to supply the electric power generated by one of the MG 21a and the MG 21b to the other. The MG 21a and the MG 21b are configured to be able to transmit and receive electric power to and from each other.

The vehicle 100 is configured to perform hybrid vehicle (HV) traveling and electric vehicle (EV) traveling. The HV traveling is traveling performed by operating the engine 31 and the MG 21b with the engine 31 generating driving force for travel. The EV traveling is traveling performed by operating the MG 21b with the engine 31 stopped. When the engine 31 is stopped, combustion is not performed in the cylinders. When the combustion in the cylinders is stopped, the engine 31 does not generate combustion energy (the driving force for travel). The HV ECU 50 is configured to switch between the EV traveling and the HV traveling depending on the situation.

Figure 2:
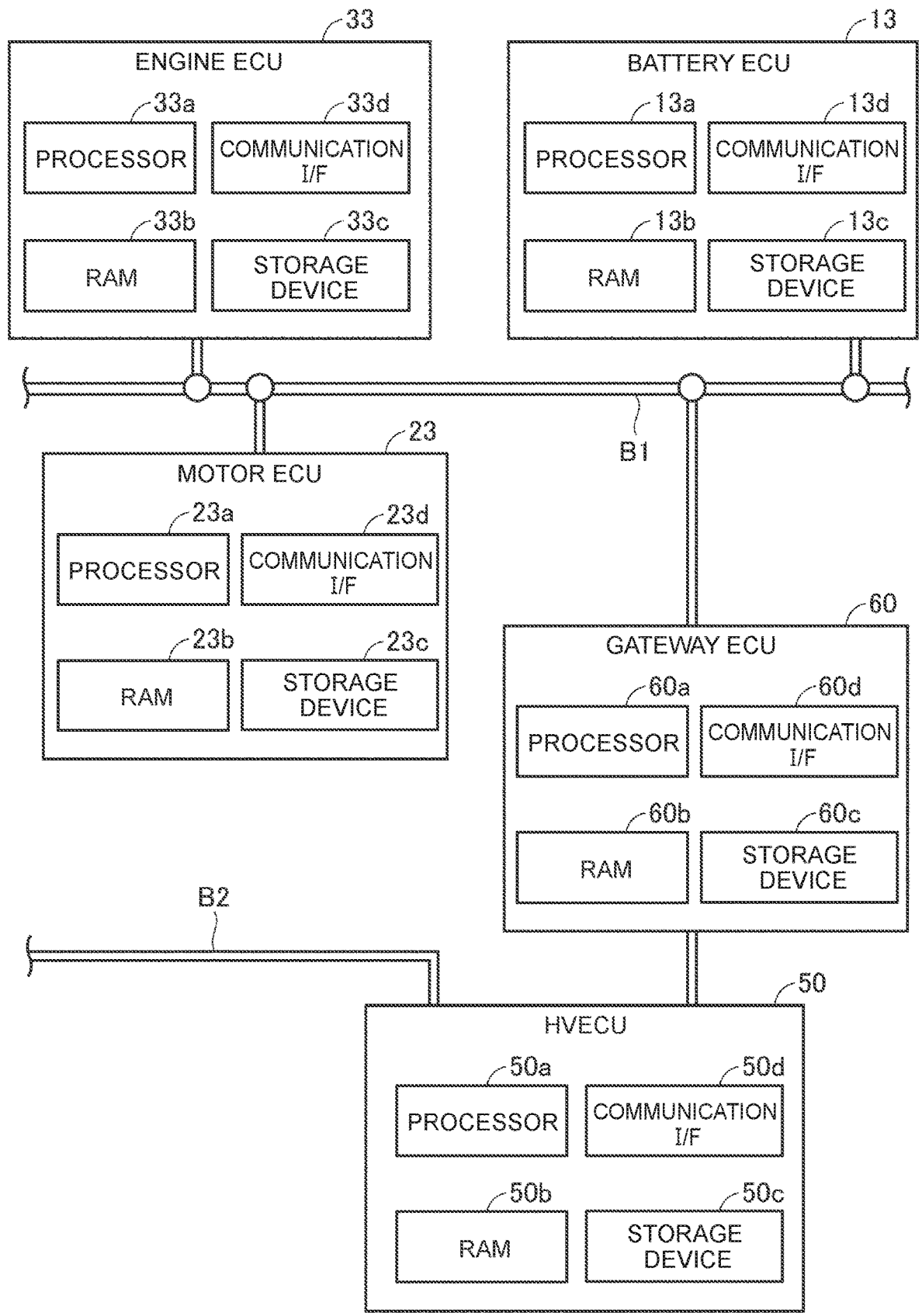
FIG. 2 is a diagram showing a connection mode of control devices included in the vehicle according to the embodiment of the present disclosure.

FIG. 2 is a diagram showing a connection mode of the control devices included in the vehicle 100 according to the present embodiment. Referring to FIG. 2 together with FIG. 1, the vehicle 100 includes an in-vehicle local area network (LAN) including a local bus B1 and a global bus B2. The control devices (for example, the battery ECU 13, the motor ECU 23, and the engine ECU 33) mounted on the vehicle 100 are connected to the in-vehicle LAN. In the present embodiment, a controller area network (CAN) is employed as a communication protocol of the in-vehicle LAN. The local bus B1 and the global bus B2 are, for example, CAN buses. However, the communication protocol of the in-vehicle LAN is not limited to the CAN, and may be any protocol such as FlexRay.

The battery ECU 13, the motor ECU 23, and the engine ECU 33 are connected to the local bus B1. Although not shown, a plurality of control devices is connected to the global bus B2. The control devices connected to the global bus B2 include, for example, a human machine interface (HMI) control device. Examples of the HMI control device include a control device that controls a navigation system or a meter panel. The global bus B2 is connected to another global bus via a central gateway (CGW) not shown.

The HV ECU 50 is connected to the global bus B2. The HV ECU 50 is configured to perform CAN communication with each control device connected to the global bus B2. The HV ECU 50 is connected to the local bus B1 via the gateway ECU 60. The gateway ECU 60 is configured to relay communication between the HV ECU 50 and each control device (for example, the battery ECU 13, the motor ECU 23, and the engine ECU 33) that is connected to the local bus B1. The HV ECU 50 is configured to mutually perform CAN communication with each control device connected to the local bus B1 via the gateway ECU 60. The gateway ECU 60 may be configured to collect and save data regarding the vehicle 100 (for example, various pieces of information acquired by the in-vehicle sensors, and IWin, IWout, Win, Wout and control commands $S_{M1}$, $S_{M2}$, $S_E$ described later). Further, the gateway ECU 60 may have a firewall function. The gateway ECU 60 may be configured to detect unauthorized communication in cooperation with at least one of the firewall function and an error detection function of the CAN communication.

In the present embodiment, a microcomputer is used as the battery ECU 13, the motor ECU 23, the engine ECU 33, the HV ECU 50, and the gateway ECU 60. The battery ECU 13 includes a processor 13a, a random access memory (RAM) 13b, a storage device 13c, and a communication interface (I/F) 13d. The motor ECU 23 includes a processor 23a, a RAM 23b, a storage device 23c, and a communication I/F 23d. The engine ECU 33 includes a processor 33a, a RAM 33b, a storage device 33c, and a communication I/F 33d. The HV ECU 50 includes a processor 50a, a RAM 50b, a storage device 50c, and a communication I/F 50d. The gateway ECU 60 includes a processor 60a, a RAM 60b, a storage device 60c, and a communication I/F 60d. A central processing unit (CPU), for example, can be used as the processors. Each communication I/F includes a CAN controller. Each RAM functions as a working memory that temporarily stores data processed by the processor. Each storage device is configured to be able to save stored information. Each storage device includes, for example, a read-only memory (ROM) and a rewritable nonvolatile memory. Each storage device stores, in addition to a program, information that is used in the program (for example, a map, a mathematical expression, and various parameters). Various controls of the vehicle 100 are executed when the processors execute the programs stored in the storage devices. However, the present disclosure is not limited to this, and various controls may be executed by dedicated hardware (electronic circuit). The number of processors included in each ECU is not limited, and any ECU may include a plurality of processors.

Charge/discharge control of the battery 11 will be described referring to FIG. 1 again. Hereinafter, the input power of the battery 11 and the output power of the battery 11 are collectively referred to as "battery power". The HV ECU 50 determines target battery power using the SOC of the battery 11. Then, the HV ECU 50 controls charge/discharge of the battery 11 so that the battery power becomes closer to the target battery power. However, such charge/discharge control of the battery 11 is restricted by input/output restriction described later. Hereinafter, the target battery power on the charging side (input side) may be referred to as "target input power", and the target battery power on the discharging side (output side) may be referred to as "target output power". In the present embodiment, the power on the discharging side is represented by a positive (+) value and the power on the charging side is represented by a negative (−) value. However, when comparing the magnitude of the power, the absolute value is used regardless of the positive or negative sign (+/−). That is, the magnitude of the power is smaller as the value becomes closer to zero. When an upper limit value and a lower limit value are set for the power, the upper limit value is located on the side where the absolute value of the power is large, and the lower limit value is located on the side where the absolute value of the power is small. The power exceeding the upper limit value on the positive side means that the power becomes larger on the positive side than the upper limit value (that is, the power moves away to the positive side with respect to zero). The power exceeding the upper limit value on the negative side means that the power becomes larger on the negative side than the upper limit value (that is, the power moves away to the negative side with respect to zero). The SOC indicates the remaining charge amount and, for example, the ratio of the current charge amount to the charge amount in the fully charged state is represented by a range between 0% and 100%. As the measuring method of the SOC, a known method such as a current integration method or an open circuit voltage (OCV) estimation method can be adopted.

Figure 3:
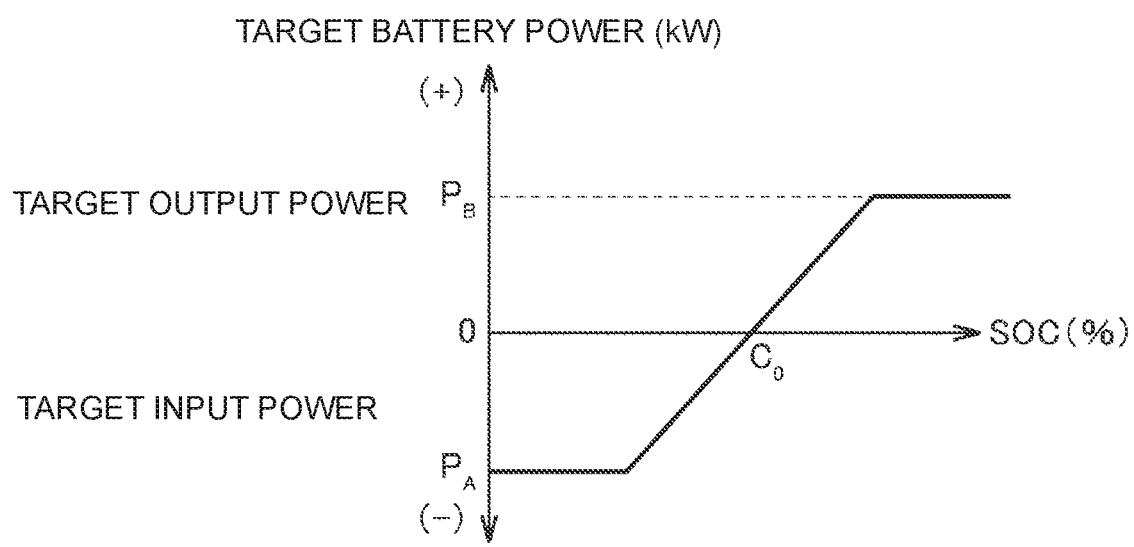
FIG. 3 is a diagram showing an example of a map used to set a target battery power in the vehicle according to the embodiment of the present disclosure.

FIG. 3 is a diagram showing an example of a map used for determining the target battery power. In FIG. 3, a reference value $C_0$ indicates a control center value of the SOC, a power value $P_A$ indicates a maximum value of the target input power, and a power value $P_B$ indicates a maximum value of the target output power. Referring to FIG. 3 together with FIG. 1, according to this map, when the SOC of the battery 11 is the reference value $C_0$, the target battery power is "0", and the battery 11 is neither charged nor discharged. In the region where the SOC of the battery 11 is smaller than the reference value $C_0$ (excessive discharge region), the target input power is larger as the SOC of the battery 11 is smaller until the target input power reaches the maximum value (power value $P_A$). In contrast, in a region where the SOC of the battery 11 is larger than the reference value $C_0$ (overcharge region), the target output power is larger as the SOC of the battery 11 is larger until the target output power reaches the maximum value (power value $P_B$). The HV ECU 50 determines the target battery power in accordance with the map shown in FIG. 3, and charges and discharges the battery 11 so that the battery power becomes closer to the determined target battery power, thereby bringing the SOC of the battery 11 closer to the reference value $C_0$. The reference value $C_0$ of the SOC may be a fixed value or may be variable depending on the situation of the vehicle 100.

The HV ECU 50 is configured to perform input restriction and output restriction of the battery 11. The HV ECU 50 sets a first power upper limit value (hereinafter, referred to as "Win") indicating an upper limit value of the input power of the battery 11 and a second power upper limit value (hereinafter, referred to as "Wout") indicating an upper limit value of the output power of the battery 11, and controls battery power such that the battery power does not exceed the set Win and Wout. The HV ECU 50 adjusts the battery power by controlling the engine 31 and the PCU 24. When Win or Wout is smaller (that is, closer to zero) than the target battery power, the battery power is controlled to Win or Wout instead of the target battery power. In the present embodiment, Wout corresponds to an example of the "power upper limit value" according to the present disclosure.

The battery ECU 13 is configured to use a detection value of the battery sensor 12 to obtain a first current upper limit value (hereinafter, also referred to as "IWin") indicating an upper limit value of the input current of the battery 11. The battery ECU 13 is also configured to use a detection value of the battery sensor 12 to obtain a second current upper limit value (hereinafter, also referred to as "IWout") indicating an upper limit value of the output current of the battery 11. That is, the battery pack 10 corresponds to a current restricting battery pack. On the other hand, the HV ECU 50 is configured to use Win to control the input power of the battery 11. The HV ECU 50 is configured to perform power-based input restriction (that is, a process of controlling the input power of the battery 11 so that the input power of the battery 11 does not exceed Win). Further, the HV ECU 50 is configured to use Wout to control the output power of the battery 11. The HV ECU 50 is configured to perform power-based output restriction (that is, a process of controlling the output power of the battery 11 so that the output power of the battery 11 does not exceed Wout). That is, the HV ECU 50 corresponds to a power restricting control device. In the present embodiment, IWout corresponds to an example of the "current upper limit value" according to the present disclosure.

As described above, the vehicle 100 includes the current restricting battery pack (that is, the battery pack 10) and the power restricting control device (that is, the HV ECU 50). In the vehicle 100, the current restricting battery pack and the power restricting control device are used in combination. IWin and IWout are output from the battery pack 10, and IWin and IWout are respectively converted into Win and Wout by the gateway ECU 60 interposed between the battery pack 10 and the HV ECU 50. Thereby, Win and Wout are input to the HV ECU 50. With this configuration, the HV ECU 50 can appropriately perform power-based input restriction and power-based output restriction on the battery 11 included in the battery pack 10.

Figure 4:
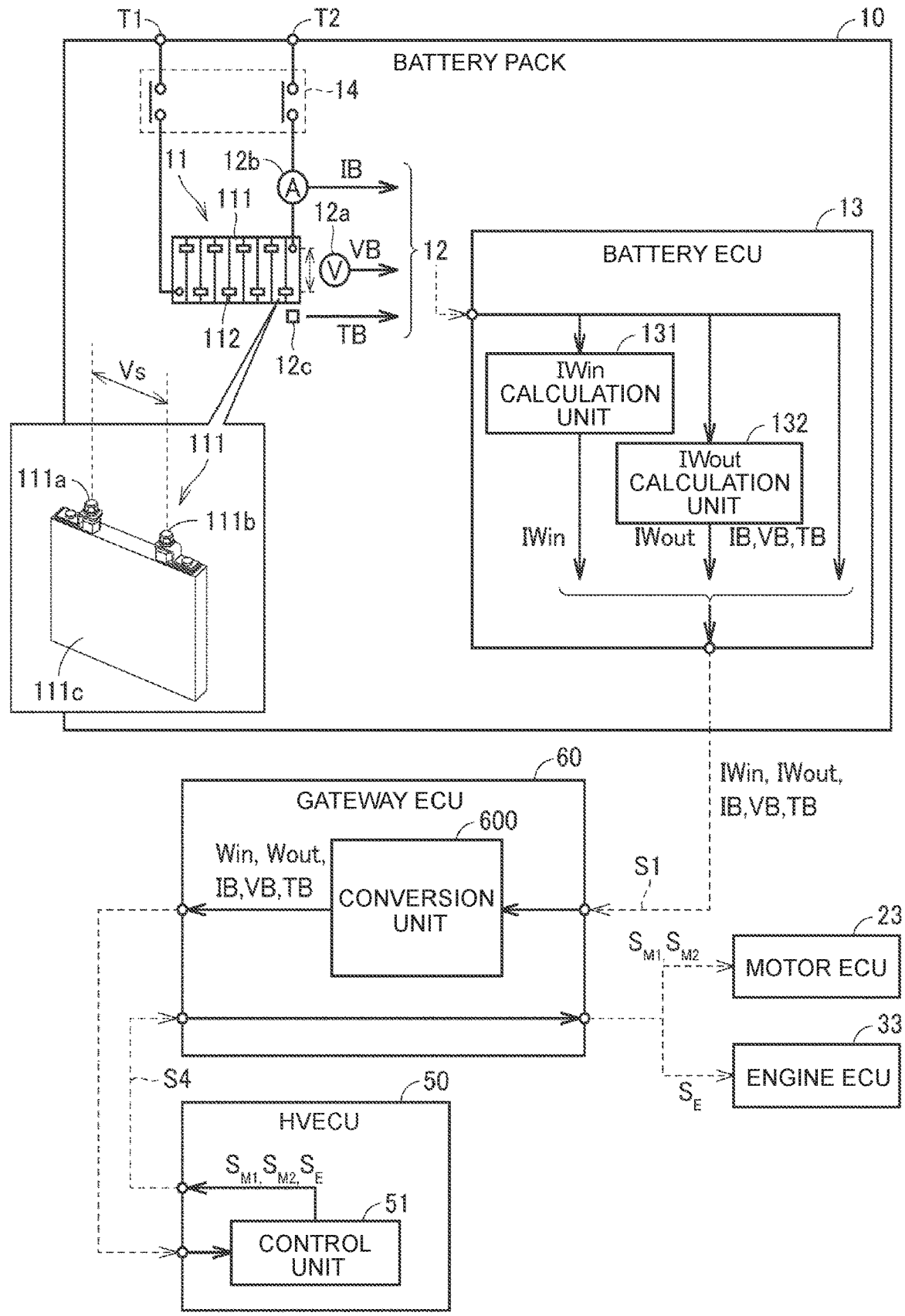
FIG. 4 is a diagram showing a detailed configuration of a battery pack, a gateway electronic control unit (ECU), and a hybrid vehicle (HV) ECU shown in FIG. 1.

FIG. 4 is a diagram showing a detailed configuration of the battery pack 10, the gateway ECU 60, and the HV ECU 50. S1 and S4 in FIG. 4 indicate a first step and a fourth step, respectively, which will be described later. Referring to FIG. 4 together with FIG. 2, in the present embodiment, the battery 11 included in the battery pack 10 is an assembled battery including a plurality of cells 111. Each cell 111 is, for example, a lithium ion battery. Each cell 111 includes a positive electrode terminal 111a, a negative electrode terminal 111b, and a battery case 111c. The voltage between the positive electrode terminal 111a and the negative electrode terminal 111b corresponds to a cell voltage Vs. In the battery 11, the positive electrode terminal 111a of one cell 111 and the negative electrode terminal 111b of another cell 111 adjacent to the one cell 111 are electrically connected to each other by a bus bar 112 having conductivity. The cells 111 are connected to each other in series. However, the present disclosure is not limited to this, and any connection mode may be adopted in the assembled battery.

The battery pack 10 includes the battery sensor 12, the battery ECU 13, and the SMR 14 in addition to the battery 11. Signals output from the battery sensor 12 to the battery ECU 13 (hereinafter, also referred to as "battery sensor signals") include a voltage signal VB output from the voltage sensor 12a, a current signal IB output from the current sensor 12b, and a temperature signal TB output from the temperature sensor 12c. The voltage signal VB indicates a measured value of the voltage of each cell 111 (cell voltage Vs). The current signal IB indicates a measured value of the current flowing through the battery 11 (the charging side takes a negative value). The temperature signal TB indicates a measured value of the temperature of each cell 111.

The battery ECU 13 repeatedly obtains the latest battery sensor signals. The interval at which the battery ECU 13 obtains the battery sensor signals (hereinafter also referred to as "sampling cycle") may be a fixed value or may be variable. In the present embodiment, the sampling cycle is 8 ms. However, the present disclosure is not limited to this, and the sampling cycle may be variable within a predetermined range (for example, a range from 1 msec to 1 sec). Hereinafter, the number of times the battery ECU 13 obtains the battery sensor signals per unit time may be referred to as "sampling rate". There is a tendency that the higher the sampling rate is, the higher the accuracy of obtaining Win and Wout (that is, conversion accuracy) through the conversion process described later is.

The battery ECU 13 includes an IWin calculation unit 131 and an IWout calculation unit 132. The IWin calculation unit 131 is configured to use the detection value of the battery sensor 12 (that is, the battery sensor signals) to obtain IWin. A known method can be used as the calculation method of IWin. The IWin calculation unit 131 may determine IWin so that charge current restriction is performed to protect the battery 11. IWin may be determined to suppress overcharge, Li deposition, high rate deterioration, and battery overheating in the battery 11, for example. The IWout calculation unit 132 is configured to use the detection value of the battery sensor 12 (that is, the battery sensor signals) to obtain IWout. A known method can be used as the calculation method of IWout. The IWout calculation unit 132 may determine IWout so that discharge current restriction is performed to protect the battery 11. IWout may be determined to suppress overdischarge, Li deposition, high rate deterioration, and battery overheating in the battery 11, for example. In the battery ECU 13, for example, the IWin calculation unit 131 and the IWout calculation unit 132 are implemented by the processor 13a shown in FIG. 2 and the program executed by the processor 13a. However, the present disclosure is not limited to this, and the IWin calculation unit 131 and the IWout calculation unit 132 may be implemented by dedicated hardware (electronic circuit).

The battery pack 10 outputs IWin calculated by the IWin calculation unit 131, IWout calculated by the IWout calculation unit 132, and the signals obtained from the battery sensor 12 (that is, the battery sensor signals) to the gateway ECU 60. These pieces of information are output from the battery ECU 13 included in the battery pack 10 to the gateway ECU 60 provided outside the battery pack 10. As shown in FIG. 2, the battery ECU 13 and the gateway ECU 60 exchange information through CAN communication.

Figure 5:
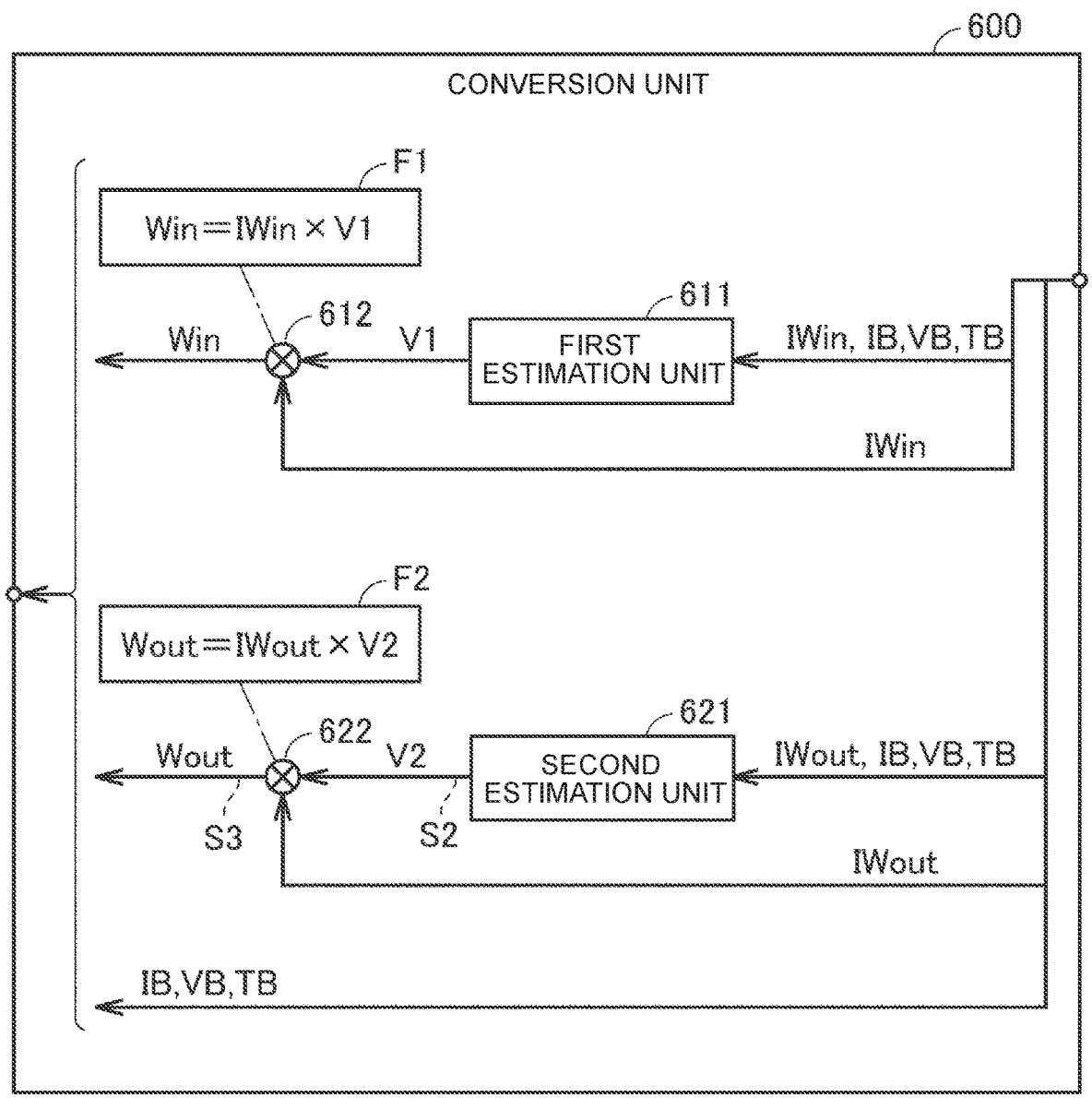
FIG. 5 is a diagram showing a detailed configuration of a conversion unit shown in FIG. 4.

The gateway ECU 60 includes a conversion unit 600 described below. FIG. 5 is a diagram showing a detailed configuration of the conversion unit 600. S2 and S3 in FIG. 5 indicate a second step and a third step, respectively, which will be described later. Referring to FIG. 5 together with FIG. 4, the conversion unit 600 includes a first estimation unit 611, a second estimation unit 621, and calculation units 612 and 622. In the gateway ECU 60, for example, the conversion unit 600 (and therefore the first estimation unit 611, the second estimation unit 621, and the calculation units 612 and 622) is implemented by the processor 60a shown in FIG. 2 and the program executed by the processor 60a. However, the present disclosure is not limited to this, and the conversion unit 600 may be implemented by dedicated hardware (electronic circuit). The conversion unit 600 according to the present embodiment corresponds to an example of a "converter" according to the present disclosure.

The first estimation unit 611 estimates a voltage value (hereinafter, referred to as "V1") of the battery 11 in a state where a current corresponding to IWin is flowing. In addition, the second estimation unit 621 estimates a voltage value (hereinafter, referred to as "V2") of the battery 11 in a state where a current corresponding to IWout is flowing. V2 according to the present embodiment corresponds to an example of an "estimated voltage value" according to the present disclosure.

Figure 6:
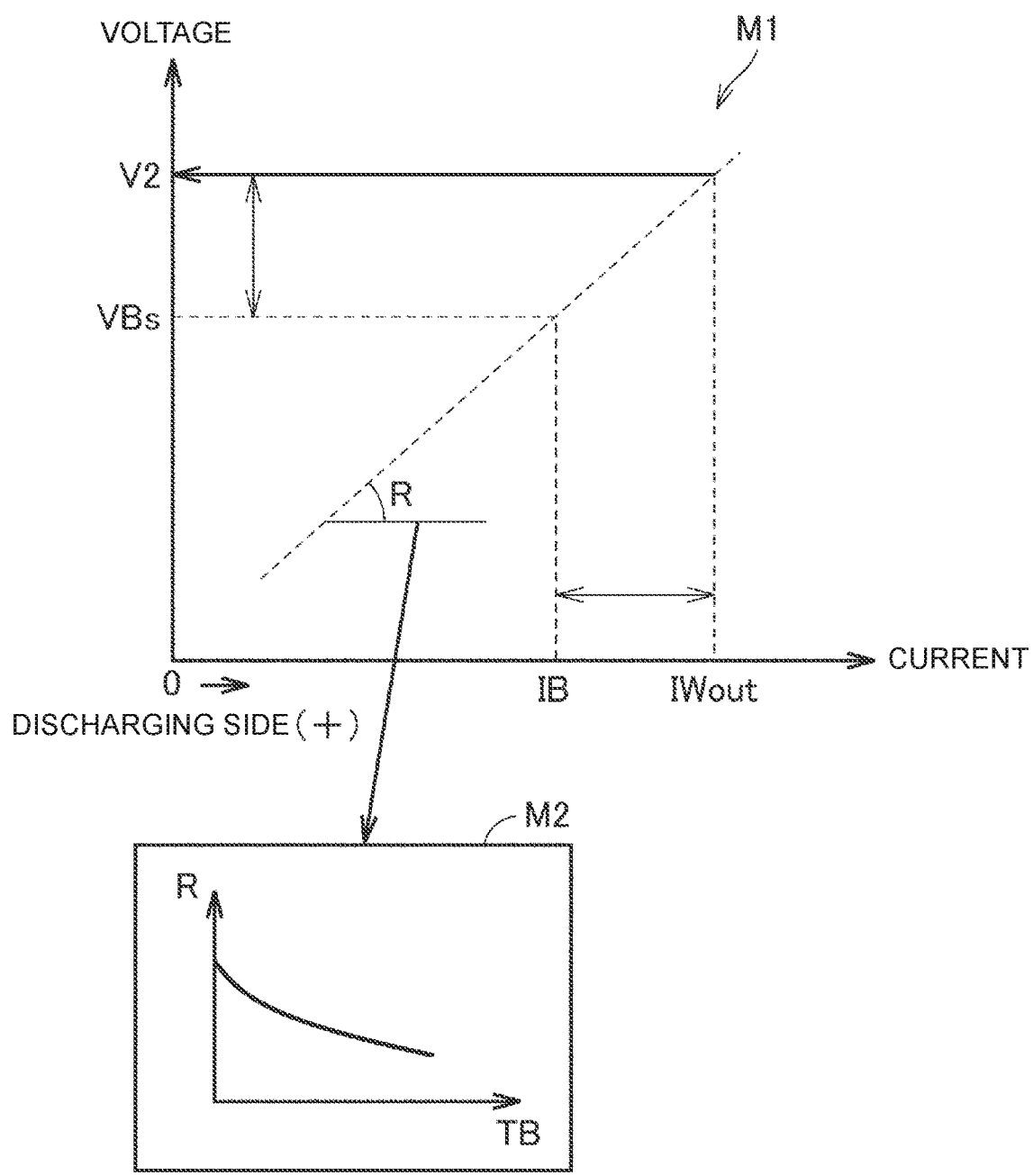
FIG. 6 is a diagram for describing a method of obtaining an estimated voltage value according to the embodiment of the present disclosure.

FIG. 6 is a diagram for describing the method of estimating V2 with the second estimation unit 621. Referring to FIG. 6 together with FIG. 5, the second estimation unit 621 uses the actual current and the actual voltage of the battery 11 (that is, the measured values of the current and the voltage of the battery 11 detected by the battery sensor 12), the internal resistance of the battery 11, and IWout to obtain V2. A graph M1 in FIG. 6 shows the following relational expression.

$$V2 = VBs + (IWout - IB) \times R$$

In the above relational expression, "R" indicates the internal resistance, "IB" indicates the actual current, and "VBs" indicates the actual voltage. In the present embodiment, the average cell voltage (that is, the average value of the voltages of all the cells 111) is adopted as VBs. However, the present disclosure is not limited to this. Instead of the average cell voltage, the maximum cell voltage (that is, the highest voltage value among the voltages of the cells 111), the minimum cell voltage (that is, the lowest voltage value among the voltages of the cells 111), or the inter-terminal voltage of the assembled battery (that is, the voltage applied between the external connection terminals T1 and T2 when the SMR 14 is in the closed state) may be adopted as VBs. The second estimation unit 621 can obtain VBs using the battery sensor signals (particularly, the voltage signal VB). The above relational expression is stored in the storage device 60c (FIG. 2) in advance. The above relational expression may include a predetermined correction term (for example, a correction term regarding polarization).

In the present embodiment, the second estimation unit 621 refers to a map M2 to obtain the internal resistance of the battery 11. In the map M2, "R" indicates the internal resistance and "TB" indicates the temperature of the battery 11. The map M2 is information indicating the relationship between the temperature (TB) of the battery 11 and the internal resistance (R) of the battery 11, and is stored in the storage device 60c (FIG. 2) in advance. The second estimation unit 621 can obtain the internal resistance of the battery 11 from the temperature of the battery 11. The temperature of the battery 11 used to obtain the internal resistance is, for example, a measured value of the temperature of the battery 11 detected by the temperature sensor 12c. For example, any one of an average cell temperature, a maximum cell temperature, and a minimum cell temperature may be adopted as the temperature of the battery 11. As shown in the map M2, the internal resistance of the battery 11 tends to decrease as the temperature of the battery 11 increases. The second estimation unit 621 may periodically detect the actual current and the actual voltage, and correct the map M2 based on the relationship between the actual current and the actual voltage.

The method of estimating V2 with the second estimation unit 621 has been described above with reference to FIG. 6. V1 is also estimated by a method similar to the above-described method of estimating V2. The first estimation unit 611 estimates V1 in accordance with the following relational expression. Since the method of estimating V1 with the first estimation unit 611 is basically the same as the method of estimating V2 described above, only the relational expression is shown and the detailed description is omitted.

$$V1 = VBs - (IWin - IB) \times R$$

Referring again to FIG. 4 and FIG. 5, the calculation unit 612 uses V1 obtained by the first estimation unit 611 to convert IWin into Win. More specifically, the calculation unit 612 converts IWin into Win by performing the calculation represented by the following expression F1. The expression F1 is stored in advance in the storage device 60c (FIG. 2).

$$Win = IWin \times V1 \quad (F1)$$

The calculation unit 612 receives V1 from the first estimation unit 611 and multiplies IWin input from the battery pack 10 (FIG. 4) by V1. In this way, the calculation unit 612 converts IWin into Win by multiplying IWin by V1 in accordance with the above expression F1.

The calculation unit 622 uses V2 obtained by the second estimation unit 621 to convert IWout into Wout. More specifically, the calculation unit 622 converts IWout into Wout by performing the calculation represented by the following expression F2. The expression F2 is stored in advance in the storage device 60c (FIG. 2).

$$Wout = IWout \times V2 \quad (F2)$$

The calculation unit 622 receives V2 from the second estimation unit 621 and multiplies IWout input from the battery pack 10 (FIG. 4) by V2. In this way, the calculation unit 622 converts IWout into Wout by multiplying IWout by V2 in accordance with the above expression F2.

Referring to FIG. 4, when IWin, IWout, and the battery sensor signals are input from the battery pack 10 to the gateway ECU 60, the conversion unit 600 of the gateway ECU 60 (see FIG. 5 for the detailed configuration) converts IWin and IWout into Win and Wout, respectively. Then, Win, Wout, and the battery sensor signals are output from the gateway ECU 60 to the HV ECU 50. The gateway ECU 60 sequentially obtains IWin, IWout, and VBs from the battery pack 10 in real time, calculates Win and Wout, and transmits Win and Wout to the HV ECU 50. Win and Wout transmitted from the gateway ECU 60 to the HV ECU 50 are sequentially updated using the latest IWin, IWout, and VBs (that is, real-time values). As shown in FIG. 2, the gateway ECU 60 and the HV ECU 50 exchange information through CAN communication.

The HV ECU 50 includes a control unit 51 described below. In the HV ECU 50, for example, the control unit 51 is implemented by the processor 50a shown in FIG. 2 and the program executed by the processor 50a. However, the present disclosure is not limited to this, and the control unit 51 may be implemented by dedicated hardware (electronic circuit).

The control unit 51 is configured to use Win to control the input power of the battery 11. Further, the control unit 51 is configured to use Wout to control the output power of the battery 11. In the present embodiment, the control unit 51 creates the control commands $S_{M1}$, $S_{M2}$, and $S_E$ for the MG 21a, MG 21b, and the engine 31 shown in FIG. 1, respectively, so that the input power and the output power of the battery 11 do not exceed Win and Wout, respectively. The control unit 51 outputs the control commands $S_{M1}$ and $S_{M2}$ for the MG 21a and the MG 21b to the motor ECU 23, and outputs the control command $S_E$ for the engine 31 to the engine ECU 33. The control commands $S_{M1}$ and $S_{M2}$ output from the HV ECU 50 are sent to the motor ECU 23 through the gateway ECU 60. The motor ECU 23 controls the PCU 24 (FIG. 1) in accordance with the received control commands $S_{M1}$ and $S_{M2}$. The control command $S_E$ output from the HV ECU 50 is sent to the engine ECU 33 through the gateway ECU 60. The engine ECU 33 controls the engine 31 in accordance with the received control command $S_E$. The MG 21a, the MG 21b, and the engine 31 are controlled in accordance with the control commands $S_{M1}$, $S_{M2}$, and $S_E$, so that the input power and the output power of the battery 11 are controlled so as not to exceed Win and Wout, respectively. The HV ECU 50 can adjust the input power and the output power of the battery 11 by controlling the engine 31 and the PCU 24. The HV ECU 50 sequentially obtains Win and Wout from the gateway ECU 60 in real time, creates the control commands $S_{M1}$, $S_{M2}$, and $S_E$ using the latest Win and Wout (that is, real-time values), and transmits the control commands $S_{M1}$, $S_{M2}$, and $S_E$ to the motor ECU 23 and the engine ECU 33.

As described above, the vehicle 100 according to the present embodiment includes the battery pack 10 including the battery ECU 13, and the HV ECU 50 and the gateway ECU 60 that are provided separately from the battery pack 10. The gateway ECU 60 is configured to relay communication between the battery ECU 13 and the HV ECU 50. The conversion unit 600 is included in the gateway ECU 60. The conversion unit 600 converts IWin into Win by multiplying V1 (that is, the voltage value of the battery 11 in the state where the current corresponding to IWin is flowing) by IWin. The conversion unit 600 converts IWout into Wout by multiplying V2 (that is, the voltage value of the battery 11 in the state where the current corresponding to IWout is flowing) by IWout. The battery ECU 13 is configured to use the detection value of the battery sensor 12 to obtain IWin (that is, the current upper limit value indicating the upper limit value of the input current of the battery 11) and IWout (that is, the current upper limit value indicating the upper limit value of the output current of the battery 11). The battery pack 10 is configured to output IWin and IWout. When IWin and IWout are input from the battery pack 10 to the gateway ECU 60, the conversion unit 600 of the gateway ECU 60 converts IWin and IWout into Win and Wout, respectively, and the gateway ECU 60 outputs Win and Wout to the HV ECU 50. The HV ECU 50 is configured to control the input power of the battery 11 using Win (that is, the power upper limit value indicating the upper limit value of the input power of the battery 11). Further, the HV ECU 50 is configured to control the output power of the battery 11 using Wout (that is, the power upper limit value indicating the upper limit value of the output power of the battery 11).

Since the vehicle 100 includes the conversion unit 600, IWin and IWout output from the current restricting battery pack (for example, the battery pack 10) can be converted into Win and Wout, respectively. Although the voltage of the battery 11 changes depending on the magnitude of the current, the conversion unit 600 can obtain Win and Wout corresponding to IWin and IWout with high accuracy by multiplying IWin and IWout by V1 and V2, respectively. The HV ECU 50 can appropriately perform the power-based input restriction and the power-based output restriction using Win and Wout thus obtained.

The control parts included in the vehicle 100 may be modularized in predetermined units to form a vehicle control system.

Figure 7:
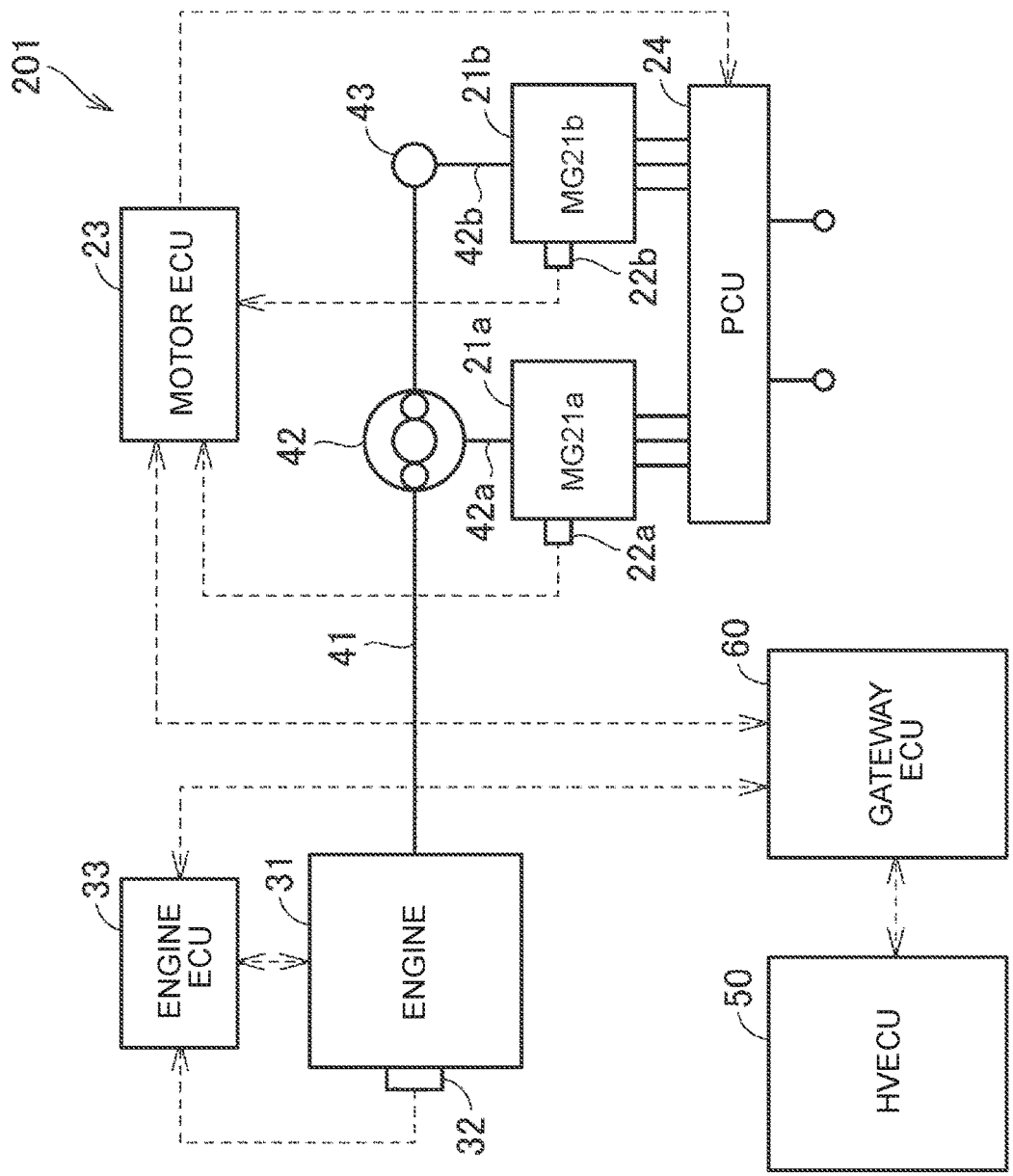
FIG. 7 is a diagram showing a first example of a vehicle control system according to the embodiment of the present disclosure.

FIG. 7 is a diagram showing a first example of the vehicle control system. Referring to FIG. 7, a vehicle control system 201 includes the MGs 21a and 21b, the motor sensors 22a and 22b, the motor ECU 23, the PCU 24, the engine 31, the engine sensor 32, the engine ECU 33, the planetary gear 42, the HV ECU 50, and the gateway ECU 60 that are modularized. The vehicle control system 201 is configured so that the battery pack 10 (FIG. 4) can be attached.

Figure 8:
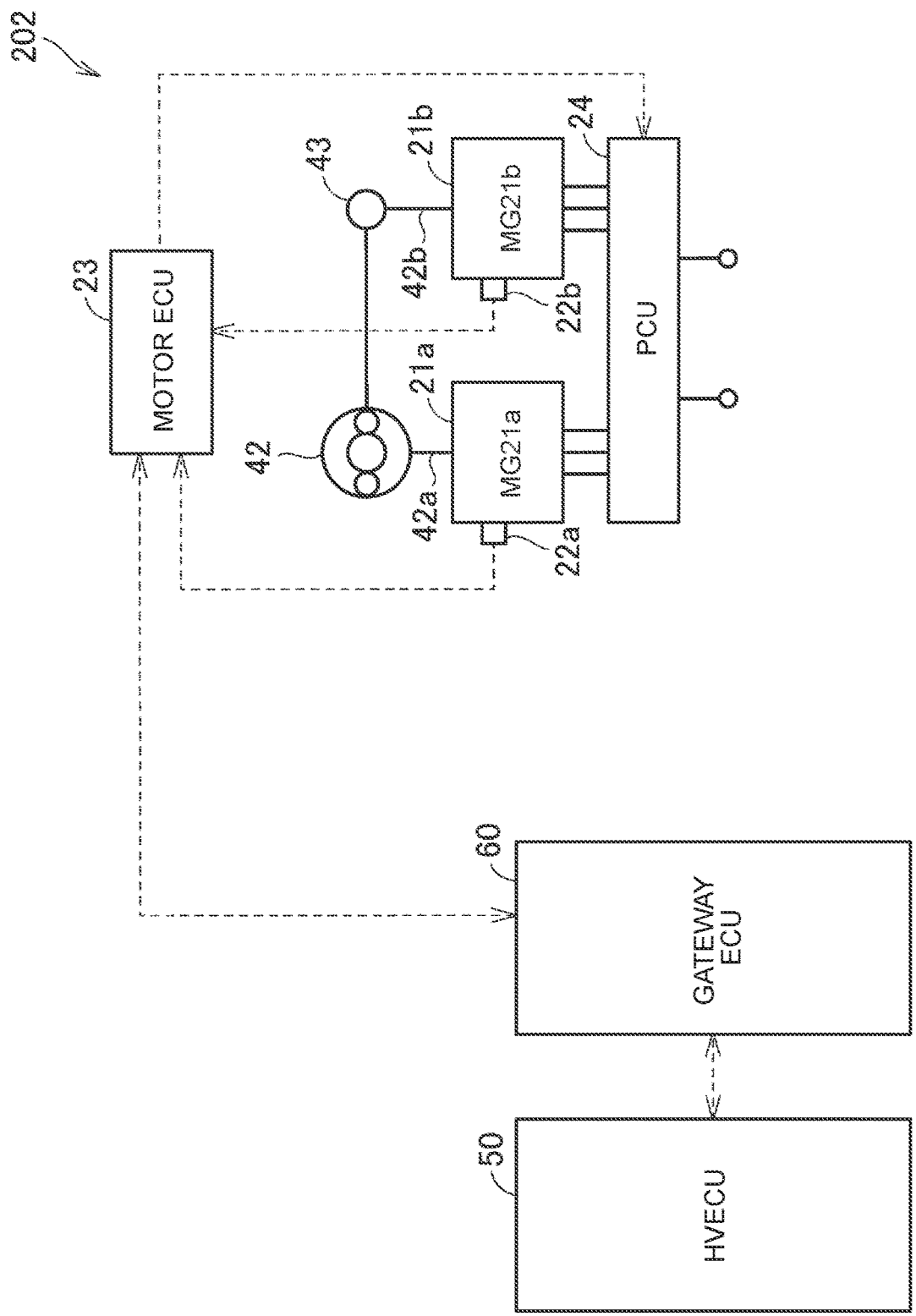
FIG. 8 is a diagram showing a second example of the vehicle control system according to the embodiment of the present disclosure.

FIG. 8 is a diagram showing a second example of the vehicle control system. Referring to FIG. 8, a vehicle control system 202 is configured by modularizing the control parts of the vehicle control system 201, excluding the engine control parts (that is, the engine 31, the engine sensor 32, and the engine ECU 33). The vehicle control system 202 is configured so that the battery pack 10 (FIG. 4) and the engine control parts can be attached.

The modularized vehicle control system can be treated as one component. Modularization of the control parts as described above facilitates manufacture of the vehicle. Modularization also enables parts to be shared between different vehicle models.

The vehicle control systems 201 and 202 each include the HV ECU 50 and the gateway ECU 60. When the battery pack 10 (FIG. 4) is attached to each of the vehicle control systems 201 and 202, the HV ECU 50 controls the input power of the battery 11 so that the input power of the battery 11 does not exceed Win and controls the output power of the battery 11 so that the output power of the battery 11 does not exceed Wout. In the vehicle control system 201, 202, the HV ECU 50 corresponds to an example of the "control unit" according to the present disclosure. When IWin is input from the battery pack 10, the gateway ECU 60 uses the detection value (for example, voltage, current, and temperature) of the battery sensor 12 and IWin to obtain V1, and multiplies IWin by V1 to convert IWin into Win. Further, when IWout is input from the battery pack 10, the gateway ECU 60 uses the detection value (for example, voltage, current, and temperature) of the battery sensor 12 and IWout to obtain V2, and multiplies IWout by V2 to convert IWout into Wout. In the vehicle control system 201, 202, the gateway ECU 60 corresponds to an example of the "conversion unit" according to the present disclosure.

In addition, the vehicle control system 201, 202 to which the battery pack 10 is attached can control the output power of the battery 11 by the vehicle control method including the first to fourth steps described below.

In the first step (for example, S1 in FIG. 4), the vehicle control system 201, 202 obtains IWout and the detection value of the battery sensor 12 from the battery pack 10. In the second step (for example, S2 in FIG. 5), the vehicle control system 201, 202 uses IWout and the detection value (for example, voltage, current, and temperature) of the battery sensor 12 to obtain V2. In the third step (for example, S3 in FIG. 5), the vehicle control system 201, 202 converts IWout into Wout by multiplying IWout by V2. In the fourth step (for example, S4 in FIG. 4), the vehicle control system 201, 202 controls the output power of the battery 11 using Wout.

The vehicle control system 201, 202 to which the battery pack 10 is attached can control the input power of the battery 11 by the vehicle control method including the fifth to eighth steps described below.

In the fifth step, the vehicle control system 201, 202 obtains IWin and the detection value of the battery sensor 12 from the battery pack 10. In the sixth step, the vehicle control system 201, 202 uses the detection value (for example, voltage, current, and temperature) of the battery sensor 12 and IWin to obtain V1. In the seventh step, the vehicle control system 201, 202 converts IWin into Win by multiplying IWin by V1. In the eighth step, the vehicle control system 201, 202 controls the input power of the battery 11 using Win.

According to the above vehicle control method, the vehicle control systems 201 and 202 can appropriately perform the power-based input restriction and the power-based output restriction using Win and Wout.

Figure 9:
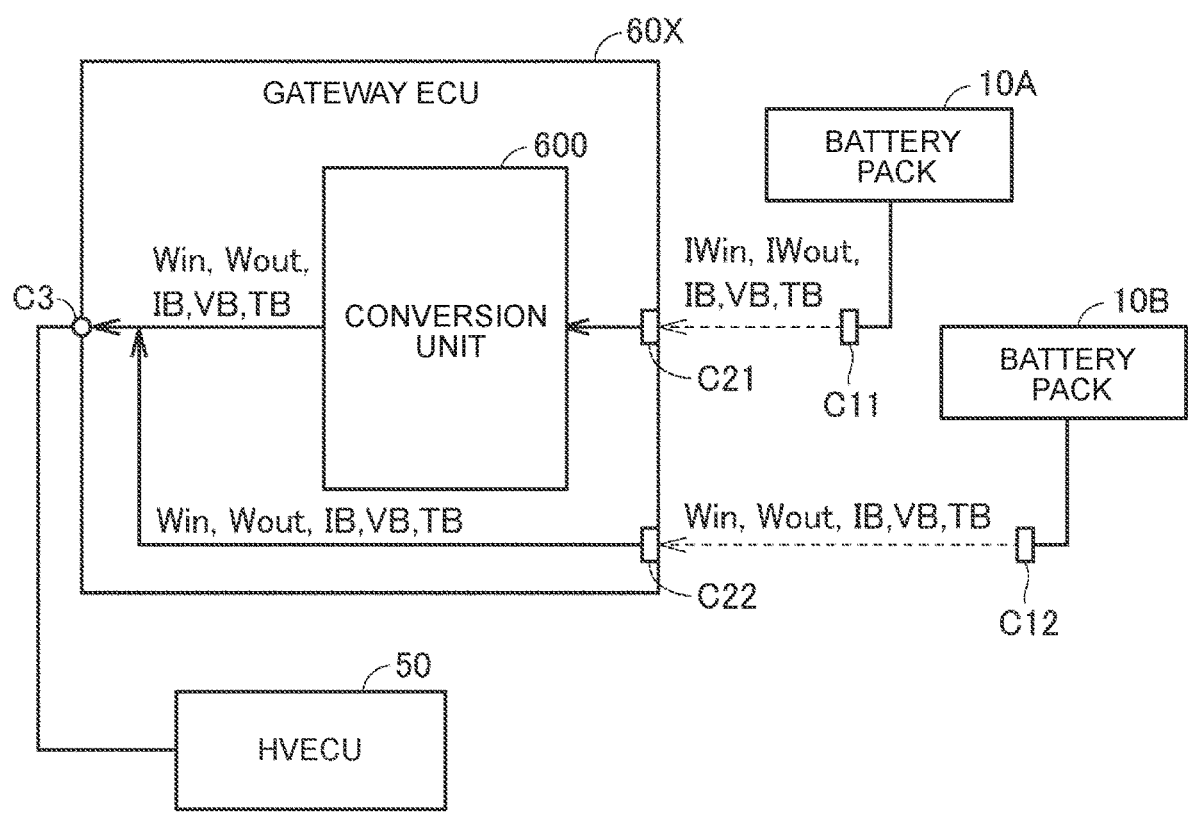
FIG. 9 is a diagram showing a modified example of the gateway ECU shown in FIG. 4.

In the above-described embodiment, when the current restricting battery pack is connected to the power restricting control device, the gateway ECU 60 is adopted so that the power-based input restriction and the power-based output restriction are performed on the secondary battery included in the current restricting battery pack. That is, in the above-described embodiment, the gateway ECU 60 that is configured to be connectable to the current restricting battery pack and that cannot be connected to the power restricting battery pack is adopted. However, the present disclosure is not limited to this, and a gateway ECU 60X shown in FIG. 9 may be adopted instead of the gateway ECU 60 adopted in the above-described embodiment. FIG. 9 is a diagram showing a modified example of the gateway ECU 60 shown in FIG. 4.

Referring to FIG. 9, the gateway ECU 60X includes a connector C21 for connecting a battery pack 10A to the gateway ECU 60X and a connector C22 for connecting a battery pack 10B to the gateway ECU 60X. The battery pack 10A is a current restricting battery pack that includes a connector C11 for external connection and that outputs IWin, IWout, and the battery sensor signals to the connector C11. The battery pack 10B is a power restricting battery pack that includes a connector C12 for external connection and that outputs Win, Wout, and the battery sensor signals to the connector C12. The HV ECU 50 is connected to an output port C3 of the gateway ECU 60X via a signal line.

When the connector C11 of the battery pack 10A is connected to the connector C21 of the gateway ECU 60X, IWin, IWout, and the battery sensor signals are input from the battery pack 10A to the connector C21. Then, the conversion unit 600 of the gateway ECU 60X converts IWin and IWout into Win and Wout, respectively, and Win, Wout, and the battery sensor signals are output to the output port C3. Then, Win, Wout, and the battery sensor signals are output from the gateway ECU 60X to the HV ECU 50.

On the other hand, when the connector C12 of the battery pack 10B is connected to the connector C22 of the gateway ECU 60X, Win, Wout, and the battery sensor signals are input from the battery pack 10B to the connector C22. The gateway ECU 60X outputs Win, Wout, and the battery sensor signals input to the connector C22 as they are to the output port C3. That is, the above conversion is not performed. Thus, Win, Wout, and the battery sensor signals are output from the gateway ECU 60X to the HV ECU 50.

As described above, when IWin and IWout are input, the gateway ECU 60X according to this modified example performs the conversion in accordance with the above expressions F1 and F2 to output Win and Wout. When Win and Wout are input, the gateway ECU 60X outputs Win and Wout without performing the above conversion. In a vehicle including the gateway ECU 60X, Win and Wout are output from the gateway ECU 60X in both a case where the current restricting battery pack 10A is used and a case where the power restricting battery pack 10B is used. Thus, in such a vehicle, the HV ECU 50 can appropriately perform the power-based input restriction and the power-based output restriction in both a case where the current restricting battery pack 10A is adopted and a case where the power restricting battery pack 10B is adopted.

In the example shown in FIG. 9, the gateway ECU 60X separately includes the input port for a current restricting battery pack (connector C21) and the input port for a power restricting battery pack (connector C22). However, the gateway ECU may be configured to be connectable to both the current restricting battery pack and the power restricting battery pack in another form. For example, the gateway ECU may include one input port to which both the current restricting battery pack and the power restricting battery pack can be connected. The gateway ECU may be configured to recognize whether the battery pack is the current restricting battery pack or the power restricting battery pack in the initial process when the battery pack is connected to the input port. When the battery pack connected to the input port is the current restricting battery pack, the gateway ECU may activate a conversion logic (for example, the conversion unit 600 shown in FIG. 9) to convert IWin and IWout input thereto into Win and Wout, respectively, and output Win and Wout to the output port. On the other hand, when the battery pack connected to the input port is the power restricting battery pack, the gateway ECU may directly output Win and Wout input thereto, to the output port without activating the conversion logic.

Figure 10:
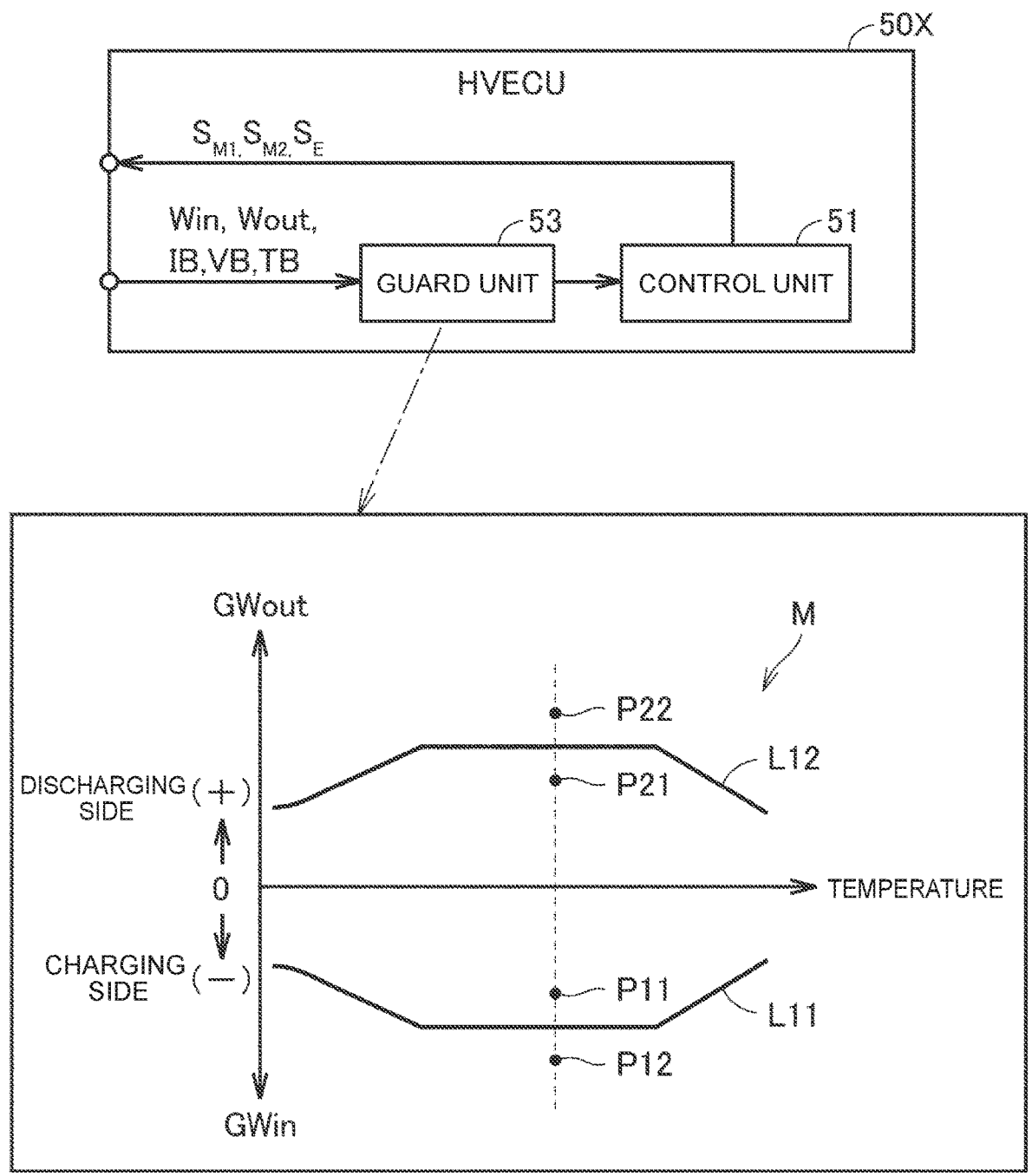
FIG. 10 is a diagram showing a modified example of the HV ECU shown in FIG. 4.

In the above-described embodiment, the number of power upper limit values required for the output restriction of the battery 11 is one. However, the present disclosure is not limited to this, and the output restriction may be performed using a plurality of power upper limit values. For example, an HV ECU 50X shown in FIG. 10 may be adopted instead of the HV ECU 50 adopted in the above embodiment. FIG. 10 is a diagram showing a modified example of the HV ECU 50 shown in FIG. 4.

Referring to FIG. 10 together with FIG. 4, the hardware configuration of the HV ECU 50X is the same as the configuration of the HV ECU 50 shown in FIG. 2. However, the HV ECU 50X includes a guard unit 53 in addition to the control unit 51. In the HV ECU 50X, for example, the control unit 51 and the guard unit 53 are implemented by the processor 50a shown in FIG. 2 and the program executed by the processor 50a. However, the present disclosure is not limited to this, and the control unit 51 and the guard unit 53 may be implemented by dedicated hardware (electronic circuit).

Win, Wout, and the battery sensor signals are input to the HV ECU 50X from the gateway ECU 60 shown in FIG. 4, for example. The guard unit 53 uses a map M to obtain a third power upper limit value (hereinafter, also referred to as "GWin") indicating the upper limit value of the input power of the battery 11 and a fourth power upper limit value (hereinafter, also referred to as "GWout") indicating the upper limit value of the output power of the battery 11. GWin is a guard value for Win, and when Win is an abnormal value (more specifically, an excessively large value), GWin restricts the input power of the battery 11 instead of Win. GWout is a guard value for Wout, and when Wout is an abnormal value (more specifically, an excessively large value), GWout restricts the output power of the battery 11 instead of Wout.

The map M is information indicating the relationship between the temperature of the battery 11 and each of GWin and GWout, and is stored in the storage device 50c (FIG. 2) in advance. A line L11 in the map M indicates the relationship between the temperature of the battery 11 and GWin. A line L12 in the map M indicates the relationship between the temperature of the battery 11 and GWout.

The guard unit 53 refers to the map M to obtain GWin and GWout in accordance with the current temperature of the battery 11. Then, the guard unit 53 outputs the smaller one of Win and GWin to the control unit 51, and outputs the smaller one of Wout and GWout to the control unit 51. For example, when the temperature of the battery 11 and Win are in a state P11 in the map M, Win is output to the control unit 51, and when the temperature of the battery 11 and Win are in a state P12 in the map M, GWin (line L11) is output to the control unit 51. Hereinafter, the situation where Win exceeds GWin (for example, the situation where the state P12 is established) may be referred to as "Win with guard". When the temperature of the battery 11 and Wout are in a state P21 in the map M, Wout is output to the control unit 51, and when the temperature of the battery 11 and Wout are in a state P22 in the map M, GWout (line L12) is output to the control unit 51. Hereinafter, the situation where Wout exceeds GWout (for example, the situation where the state P22 is established) may be referred to as "Wout with guard".

The temperature of the battery 11 that is used to obtain GWin and GWout is a measured value of the temperature of the battery 11 detected by the temperature sensor 12c shown in FIG. 4, for example. For example, any one of the average cell temperature, the maximum cell temperature, and the minimum cell temperature may be adopted as the temperature of the battery 11.

In addition to the power upper limit value, the battery sensor signals are also output from the guard unit 53 to the control unit 51. The control unit 51 controls the input power and the output power of the battery 11 using the power upper limit values received from the guard unit 53. More specifically, the control unit 51 creates the control commands $S_{M1}$, $S_{M2}$ for the MG 21a, the MG 21b and the control command $S_E$ for the engine 31 shown in FIG. 1 so that the input power and the output power of the battery 11 do not exceed the power upper limit values. The control unit 51 controls the input power of the battery 11 so that the input power of the battery 11 does not exceed the smaller one of Win and GWin. As a result, the input power of the battery 11 exceeds neither Win nor GWin. The control unit 51 controls the output power of the battery 11 so that the output power of the battery 11 does not exceed the smaller one of Wout and GWout. As a result, the output power of the battery 11 exceeds neither Wout nor GWout.

The guard unit 53 may record Win with guard and Wout with guard in the storage device 50c (FIG. 2) and determine, based on the recorded data, conformity/nonconformity of the battery pack mounted on the vehicle (for example, the battery pack 10 shown in FIG. 4). For example, the guard unit 53 may determine that the battery pack is nonconforming when at least one of the frequency of "Win with guard" and the frequency of "Wout with guard" exceeds a predetermined value. In addition, the guard unit 53 may determine that the battery pack is nonconforming when at least one of the duration for which the state "Win with guard" continues and the duration for which the state "Wout with guard" continues exceeds a predetermined value.

The HV ECU 50X may record the determination result of conformity/nonconformity of the battery pack in the storage device 50c (FIG. 2). In addition, the HV ECU 50X may notify a user of the nonconformity when it is determined that the battery pack is nonconforming. This notification may prompt the user to replace the battery pack. The notification process to the user is optional, and the notification may be carried out by display (for example, display of characters or images) on a display device, by sound (including voice) from a speaker, or by lighting (including blinking) of a predetermined lamp.

Win, Wout may exceed GWin, GWout due to insufficient accuracy of conversion of IWin, IWout into Win, Wout. Thus, when Win exceeds GWin and/or when Wout exceeds GWout, the HV ECU 50X may transmit a predetermined signal to the battery ECU 13 shown in FIG. 4, so as to increase the sampling rate of the battery ECU 13 (and therefore the number of data of the battery sensor signals transmitted from the battery ECU 13 to the gateway ECU 60 per unit time).

According to the modified example shown in FIG. 10, it is possible to protect the battery 11 with GWin and GWout when Win and Wout become excessively large values for some reason.

In the above-described embodiment, the gateway ECU 60 includes the conversion unit 600. However, the present disclosure is not limited to this, and another ECU may have these functions.

Figure 11:
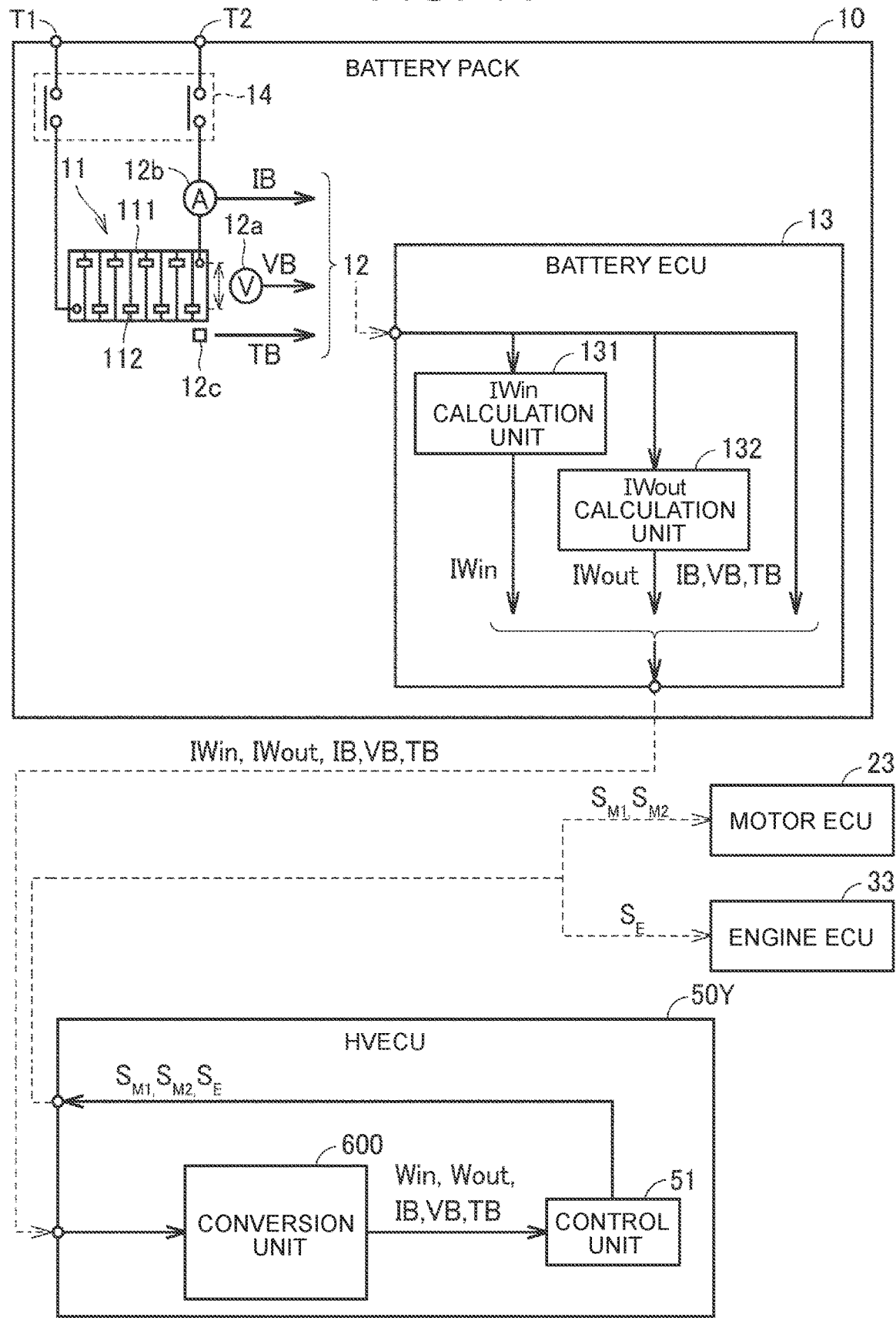
FIG. 11 is a diagram showing a first modified example of the vehicle control system shown in FIG. 4.

FIG. 11 is a diagram showing a first modified example of the vehicle control system shown in FIG. 4. Referring to FIG. 11, the vehicle control system according to the first modified example is the same as the vehicle control system shown in FIG. 4 except that an HV ECU 50Y is adopted instead of the HV ECU 50 and the gateway ECU 60 is omitted. The hardware configuration of the HV ECU 50Y is the same as the configuration of the HV ECU 50 shown in FIG. 2. However, the HV ECU 50Y includes the conversion unit 600 (see FIG. 5) in addition to the control unit 51. In the HV ECU 50Y, for example, the control unit 51 and the conversion unit 600 are implemented by the processor 50a shown in FIG. 2 and the program executed by the processor 50a. However, the present disclosure is not limited to this, and the control unit 51 and the conversion unit 600 may be implemented by dedicated hardware (electronic circuit).

The battery pack 10 outputs IWin, IWout, and the battery sensor signals to the HV ECU 50Y. The conversion unit 600 of the HV ECU 50Y converts IWin and IWout input from the battery pack 10 into Win and Wout, respectively. Win and Wout are input from the conversion unit 600 to the control unit 51. The control unit 51 creates the control commands $S_{M1}$, $S_{M2}$, and $S_E$ for the MG 21a, the MG 21b, and the engine 31 shown in FIG. 1, respectively, and outputs the control commands $S_{M1}$ and $S_{M2}$ to the motor ECU 23 and outputs the control command $S_E$ to the engine ECU 33, so that the input power and the output power of the battery 11 do not exceed Win and Wout, respectively.

In the vehicle control system according to the first modified example, the HV ECU 50Y provided separately from the battery pack 10 includes a converter (that is, the conversion unit 600), and the converter converts IWin and IWout into Win and Wout. Thus, the converter can be mounted on the vehicle without a change in the configuration of the battery pack 10. Further, the HV ECU 50Y can appropriately perform the power-based input restriction and the power-based output restriction without adding the gateway ECU 60 (FIG. 4) described above.

Figure 12:
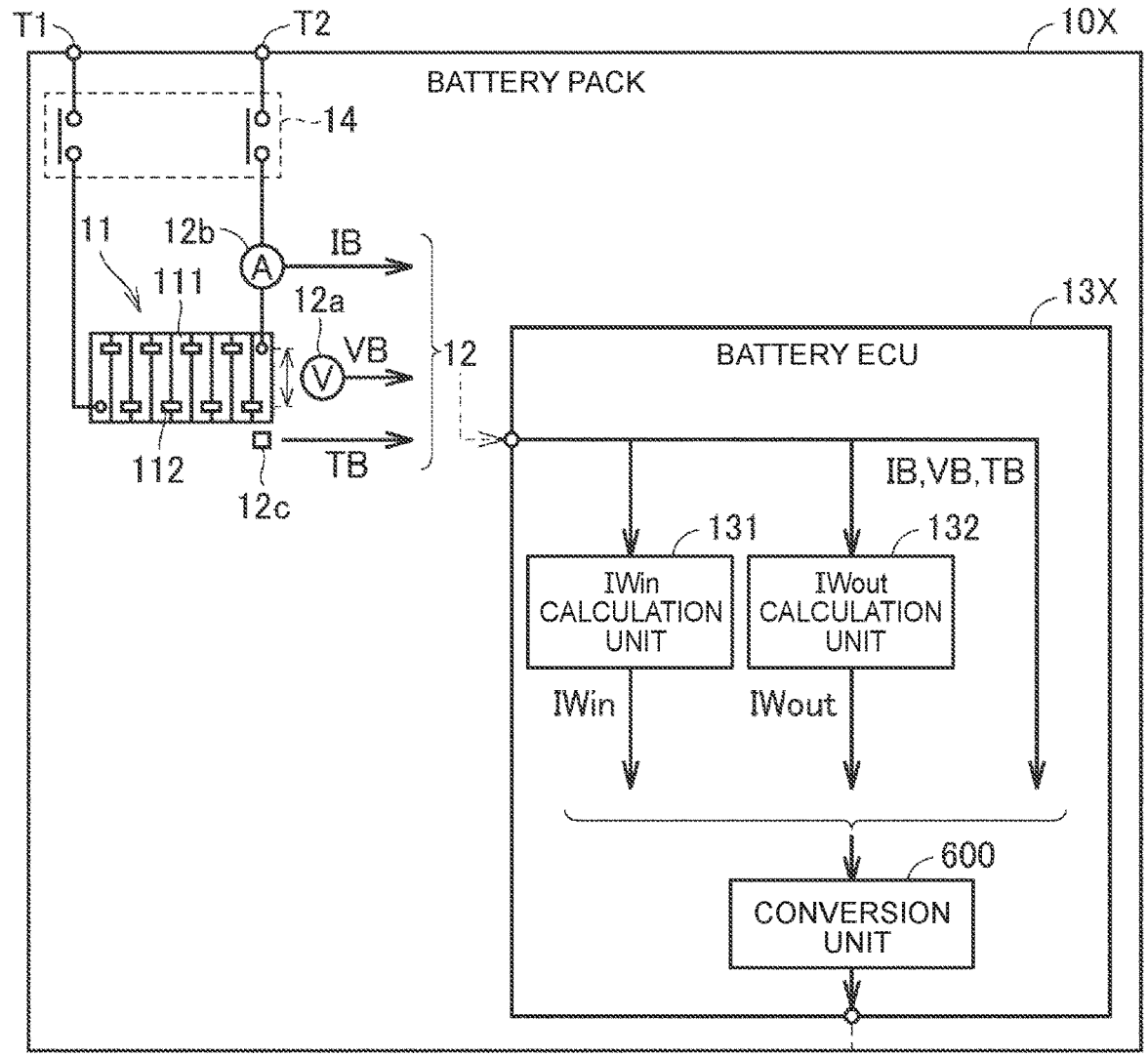
FIG. 12 is a diagram showing a second modified example of the vehicle control system shown in FIG. 4.
Figure 12:
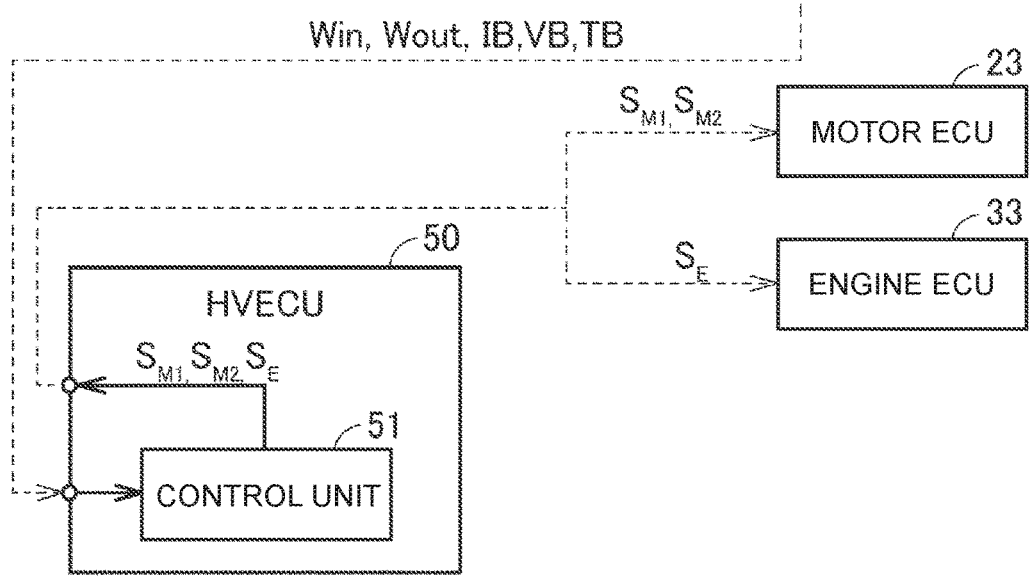

FIG. 12 is a diagram showing a second modified example of the vehicle control system shown in FIG. 4. Referring to FIG. 12, the vehicle control system according to the second modified example is the same as the vehicle control system shown in FIG. 4 except that a battery pack 10X (including a battery ECU 13X) is adopted instead of the battery pack 10 (including the battery ECU 13) and the gateway ECU 60 is omitted. The hardware configuration of the battery ECU 13X included in the battery pack 10X is the same as the configuration of the battery ECU 13 shown in FIG. 2. However, the battery ECU 13X includes the conversion unit 600 (see FIG. 5) in addition to the IWin calculation unit 131 and the IWout calculation unit 132. In the battery ECU 13X, for example, the IWin calculation unit 131, the IWout calculation unit 132, and the conversion unit 600 are implemented by the processor 13a shown in FIG. 2 and the program executed by the processor 13a. However, the present disclosure is not limited to this, and the IWin calculation unit 131, the IWout calculation unit 132, and the conversion unit 600 may be implemented by dedicated hardware (electronic circuit).

The conversion unit 600 of the battery ECU 13X receives IWin and IWout from the IWin calculation unit 131 and the IWout calculation unit 132, respectively, and converts IWin and IWout into Win and Wout. The battery pack 10X outputs Win, Wout, and the battery sensor signals to the HV ECU 50. The control unit 51 of the HV ECU 50 creates the control commands $S_{M1}$, $S_{M2}$, and $S_E$ for the MG 21a, the MG 21b, and the engine 31 shown in FIG. 1, respectively, and outputs the control commands $S_{M1}$ and $S_{M2}$ to the motor ECU 23 and outputs the control command $S_E$ to the engine ECU 33, so that the input power and the output power of the battery 11 do not exceed Win and Wout, respectively.

In the vehicle control system according to the second modified example, the converter (that is, the conversion unit 600) is incorporated in the battery ECU 13X (that is, inside the battery pack 10X). With this configuration, IWin and IWout are converted into Win and Wout inside the battery pack 10X, so Win and Wout can be output from the battery pack 10X. Therefore, the HV ECU 50 can appropriately perform the power-based input restriction and the power-based output restriction without adding the above-described gateway ECU 60 (FIG. 4).

In the above-described embodiment and each modified example, the input restriction of the secondary battery is performed conforming to the output restriction of the secondary battery, but the method of the input restriction of the secondary battery can be changed as appropriate. For example, the power upper limit value of the secondary battery on the input side may be calculated by a calculation method different from that for the power upper limit value of the secondary battery on the output side.

In the above-described embodiment and each modified example, the battery ECU 13, the motor ECU 23, and the engine ECU 33 are connected to the local bus B1 (see FIG. 2). However, the present disclosure is not limited to this, and the motor ECU 23 and the engine ECU 33 may be connected to the global bus B2.

The configuration of the vehicle is not limited to the configuration shown in FIG. 1. For example, although a hybrid vehicle is shown in FIG. 1, the vehicle is not limited to the hybrid vehicle and may be an electric vehicle on which an engine is not mounted. Further, the vehicle may be a plug-in hybrid vehicle (PHV) configured such that the secondary battery in the battery pack can be charged using electric power supplied from the outside of the vehicle. Further, the HV ECU 50 may be configured to directly control the SMR 14 bypassing the battery ECU 13. The battery 11 (secondary battery) included in the battery pack 10 is not limited to the assembled battery and may be a single battery.

The modified examples described above may be implemented in any combination. The embodiment disclosed herein should be considered as illustrative and not restrictive in all respects. The scope of the present disclosure is shown by the claims, rather than the above embodiment, and is intended to include all modifications within the meaning and the scope equivalent to those of the claims.

What is claimed is:

1. A vehicle comprising:
    a battery pack including a secondary battery, a battery sensor that detects a state of the secondary battery, and a first control device;
    a second control device provided separately from the battery pack; and
    a converter, wherein:
    the first control device is configured to use a detection value of the battery sensor to obtain a current upper limit value indicating an upper limit value of an output current of the secondary battery;
    the second control device is configured to use a power upper limit value indicating an upper limit value of an output power of the secondary battery to control the output power of the secondary battery; and
    the converter is configured to perform conversion of the current upper limit value into the power upper limit value by performing multiplication of an estimated voltage value by the current upper limit value, the estimated voltage value being a voltage value of the secondary battery in a state where a current corresponding to the current upper limit value is flowing, wherein
    the converter is mounted on the first control device, and
    the first control device is configured to perform, with the converter, the conversion of the current upper limit value obtained using the detection value of the battery sensor into the power upper limit value and to output the power upper limit value to the second control device when the first control device is connected to the second control device.

2. The vehicle according to claim 1, wherein the converter is configured to use measured values of a current and a voltage of the secondary battery that are detected by the battery sensor, an internal resistance of the secondary battery, and the current upper limit value to obtain the estimated voltage value.

3. A vehicle comprising:
    a battery pack including a secondary battery, a battery sensor that detects a state of the secondary battery, and a first control device;
    a second control device provided separately from the battery pack;
    a third control device provided separately from the battery pack and configured to relay communication between the first control device and the second control device; and
    a converter, wherein:
    the first control device is configured to use a detection value of the battery sensor to obtain a current upper limit value indicating an upper limit value of an output current of the secondary battery;
    the second control device is configured to use a power upper limit value indicating an upper limit value of an output power of the secondary battery to control the output power of the secondary battery;
    the converter is configured to perform conversion of the current upper limit value into the power upper limit value by performing multiplication of an estimated voltage value by the current upper limit value, the estimated voltage value being a voltage value of the secondary battery in a state where a current corresponding to the current upper limit value is flowing,
    the converter is mounted on the third control device;
    the battery pack is configured to output the current upper limit value; and
    the vehicle is configured such that when the current upper limit value is input from the battery pack to the third control device, the converter performs the conversion of the current upper limit value into the power upper limit value and the power upper limit value is output from the third control device to the second control device.

4. The vehicle according to claim 3, wherein the third control device is configured to perform the conversion and output the power upper limit value when the current upper limit value is input and to output the power upper limit value without performing the conversion when the power upper limit value is input.

5. The vehicle according to claim 3, wherein:
    each of the first control device, the second control device, and the third control device is a microcomputer connected to an in-vehicle local area network; and
    in the in-vehicle local area network, the first control device is connected to the second control device via the third control device to communicate with the second control device via the third control device.

6. A vehicle control method comprising:
    obtaining, with a vehicle control system to which a battery pack including a secondary battery and a battery sensor that detects a state of the secondary battery is attached, a current upper limit value indicating an upper limit value of an output current of the secondary battery and a detection value of the battery sensor, from the battery pack;
    obtaining, with the vehicle control system, an estimated voltage value using the detection value of the battery sensor and the current upper limit value, the estimated voltage value being a voltage value of the secondary battery in a state where a current corresponding to the current upper limit value is flowing;
    performing, with the battery pack, conversion of the current upper limit value into a power upper limit value indicating an upper limit value of an output power of the secondary battery by performing multiplication of the current upper limit value by the estimated voltage value and outputting the power upper limit value to the vehicle control system when the battery pack is connected to the vehicle control system; and
    controlling, with the vehicle control system, the output power of the secondary battery using the power upper limit value.

\* \* \* \* \*